(12) United States Patent
Marutani

(10) Patent No.: US 12,095,017 B2
(45) Date of Patent: Sep. 17, 2024

(54) LIGHT EMITTING DEVICE INCLUDING FLEXIBLE SUBSTRATE

(71) Applicant: NICHIA CORPORATION, Anan (JP)

(72) Inventor: Yukitoshi Marutani, Anan (JP)

(73) Assignee: NICHIA CORPORATION, Anan (JP)

(*) Notice: Subject to any disclaimer, the term of this patent is extended or adjusted under 35 U.S.C. 154(b) by 86 days.

(21) Appl. No.: 17/369,512

(22) Filed: Jul. 7, 2021

(65) Prior Publication Data

US 2021/0336112 A1    Oct. 28, 2021

Related U.S. Application Data

(62) Division of application No. 15/719,795, filed on Sep. 29, 2017, now abandoned.

(30) Foreign Application Priority Data

Sep. 30, 2016  (JP) ................................. 2016-195262

(51) Int. Cl.
*H01L 33/62*       (2010.01)
*H01L 33/48*       (2010.01)
(Continued)

(52) U.S. Cl.
CPC ............ *H01L 33/62* (2013.01); *H01L 33/486* (2013.01); *H01L 33/54* (2013.01);
(Continued)

(58) Field of Classification Search
CPC ......... H01L 33/60; H01L 33/54; H01L 33/58; H01L 33/486; H01L 33/483; H01L 33/52; H01L 33/62
(Continued)

(56) References Cited

U.S. PATENT DOCUMENTS

2004/0047151 A1    3/2004 Bogner et al.
2004/0089898 A1    5/2004 Ruhnau et al.
(Continued)

FOREIGN PATENT DOCUMENTS

JP    H06-77540 A      3/1994
JP    2006-073794 A    3/2006
(Continued)

OTHER PUBLICATIONS

The Engineering ToolBox, Young's Modulus—Tensile and Yield Strength for common Materials.*
(Continued)

*Primary Examiner* — David Chen
(74) *Attorney, Agent, or Firm* — Global IP Counselors, LLP

(57) ABSTRACT

A light emitting device includes a flexible substrate, a light emitting element, a conductive connecting material and a first holding member. The flexible substrate includes a flexible base and a wire. The first holding member is arranged on an opposite side surface to a surface of a side of the substrate on which the light emitting element is mounted. The first holding member surrounds a region corresponding to a region on the substrate including the light emitting element and the conductive connecting material in a plan view. The first holding member is arranged adjacent to the wire. The first holding member includes an inner region arranged on an inner side of the first holding member, and having higher rigidity than rigidity of the flexible base, and an outer region arranged adjacent to the inner region outside the inner region, and having lower rigidity than rigidity of the inner region.

9 Claims, 15 Drawing Sheets

(51) Int. Cl.
  *H01L 33/54* (2010.01)
  *H01L 23/538* (2006.01)
  *H01L 25/075* (2006.01)
  *H01L 33/50* (2010.01)
  *H01L 33/58* (2010.01)
  *H01L 33/60* (2010.01)
  *H01L 33/64* (2010.01)

(52) U.S. Cl.
  CPC ...... *H01L 23/5387* (2013.01); *H01L 25/0753* (2013.01); *H01L 33/502* (2013.01); *H01L 33/58* (2013.01); *H01L 33/60* (2013.01); *H01L 33/641* (2013.01); *H01L 2224/16225* (2013.01)

(58) Field of Classification Search
  USPC ........ 257/88, 98, 99, 100, E25.02, E33.059; 438/22, 26, 27, 28, 29
  See application file for complete search history.

(56) References Cited

U.S. PATENT DOCUMENTS

| | | | |
|---|---|---|---|
| 2006/0245201 A1 | 11/2006 | Wada et al. | |
| 2006/0264108 A1 | 11/2006 | Shimamori et al. | |
| 2007/0096272 A1 | 5/2007 | Wang | |
| 2009/0008662 A1* | 1/2009 | Ashdown | H01L 25/0753 257/E33.059 |
| 2009/0115313 A1 | 5/2009 | Lu et al. | |
| 2009/0140271 A1* | 6/2009 | Sah | F21K 9/64 257/E33.061 |
| 2009/0296382 A1* | 12/2009 | Maier | F21V 31/005 156/60 |
| 2010/0091501 A1* | 4/2010 | Tan | H05K 1/0204 313/46 |
| 2010/0277666 A1* | 11/2010 | Bertram | G02F 1/133603 362/249.02 |
| 2011/0007509 A1 | 1/2011 | Hayes et al. | |
| 2011/0062470 A1* | 3/2011 | Bierhuizen | H01L 33/60 257/E33.001 |
| 2011/0163683 A1* | 7/2011 | Steele | F21V 9/38 315/192 |
| 2011/0211357 A1 | 9/2011 | Preuschl et al. | |
| 2011/0291143 A1 | 12/2011 | Kim et al. | |
| 2012/0057358 A1* | 3/2012 | Wu | H05K 1/0259 362/382 |
| 2012/0062071 A1 | 3/2012 | Ebigase | |
| 2013/0015472 A1 | 1/2013 | Lo | |
| 2013/0193458 A1 | 8/2013 | Mochizuki | |
| 2014/0061684 A1 | 3/2014 | Marutani et al. | |
| 2014/0077236 A1* | 3/2014 | Yamada | H01L 33/56 257/88 |
| 2014/0104838 A1 | 4/2014 | Reiss et al. | |
| 2014/0185294 A1 | 7/2014 | Miyata | |
| 2015/0003083 A1 | 1/2015 | Uehara | |
| 2015/0145406 A1* | 5/2015 | Li | B29C 48/022 264/1.7 |
| 2015/0166847 A1 | 6/2015 | Morita et al. | |
| 2015/0216037 A1 | 7/2015 | Tomita et al. | |
| 2016/0351619 A1* | 12/2016 | Cramer | H04M 1/185 |
| 2018/0090037 A1* | 3/2018 | Tso | H01L 23/5328 |

FOREIGN PATENT DOCUMENTS

| | | |
|---|---|---|
| JP | 2006-324063 A | 11/2006 |
| JP | 2014-130967 A | 7/2014 |
| JP | 2014-203815 A | 10/2014 |
| JP | 2015-135723 A | 7/2015 |
| JP | 2015164177 A | 9/2015 |
| WO | 2009-022574 A1 | 2/2009 |
| WO | 2013-118168 A1 | 8/2013 |

OTHER PUBLICATIONS

Omnexus The material selection platform, Young's Modulus: Tensile Elasticity Unites, Factors & Material Table.
Restriction Requirement in the related U.S. Appl. No. 15/719,795, dated Sep. 13, 2018.
Non-Final Office Action in the related U.S. Appl. No. 15/719,795, dated Dec. 4, 2018.
Final Office Action in the related U.S. Appl. No. 15/719,795, dated Aug. 29, 2019.
Advisory Action in the related U.S. Appl. No. 15/719,795, dated Nov. 21, 2019.
2nd Non-Final Office Action in the related U.S. Appl. No. 15/719,795, dated Dec. 31, 2019.
2nd Final Office Action in the related U.S. Appl. No. 15/719,795, dated Apr. 16, 2020.
Advisory Action in the related U.S. Appl. No. 15/719,795, dated Aug. 5, 2020.
3rd Non-Final Office Action in the related U.S. Appl. No. 15/719,795, dated Oct. 7, 2020.
3rd Final Office Action in the related U.S. Appl. No. 15/719,795, dated Mar. 11, 2021.

* cited by examiner

LIGHT EMITTING DEVICE INCLUDING FLEXIBLE SUBSTRATE

CROSS REFERENCE TO RELATED APPLICATIONS

This application is a divisional application of U.S. patent application Ser. No. 15/719,795, filed on Sep. 29, 2017. This application claims priority to Japanese Patent Application No. 2016-195262 filed on Sep. 30, 2016. The entire disclosures of U.S. patent application Ser. No. 15/719,795 and Japanese Patent Application No. 2016-195262 are hereby incorporated herein by reference.

TECHNICAL FIELD

This disclosure relates to a light emitting device.

BACKGROUND ART

Semiconductor light emitting devices for which a semiconductor light emitting element is mounted on a flexible substrate have been put into practical application. With a conventional semiconductor light emitting device for which a semiconductor light emitting element is mounted on a flexible substrate, for example, installation is done on a surface with irregularities, and while flexibility is necessary at the time of installation, use is done in a fixed state after installation. In recent years, development and practical application of e-textiles, wearable devices, and the like (Japanese Laid-Open Patent Publication No. 2015-164177 and International Patent Publication No. WO2013/118168) has started to progress further. The semiconductor light emitting devices used for these require flexibility and elasticity after installation as well, so compared to conventional items used in a fixed state, higher connection reliability is required.

SUMMARY

With a semiconductor light emitting element such as an LED element, etc., of the power input during operation, other than the part discharged as light is discharged as heat, so there is a large amount of heat, and as the temperature rises, a local decrease in rigidity occurs in a wire base material such as a film. In this case, in addition to the occurrence of thermal expansion of the wire base material in the vicinity of the light emitting element, the deformation amount of the wire base material around the light emitting element to which external force is applied becomes greater than the deformation amount of the wire base material in a region with little temperature rise, so there is a high stress load on the light emitting element and on the conductive connecting material, etc. for connecting the light emitting element. There is a risk of defects such as wire breakage, etc. occurring on the semiconductor light emitting device due to these stress loads.

The purpose of the embodiments of the present invention is to improve the connection reliability between the light emitting element and the wire.

A light emitting device according to one aspect includes a flexible substrate, a light emitting element, a conductive connecting material and a first holding member. The flexible substrate includes a flexible base and a wire arranged on the flexible base. The light emitting element is mounted on the substrate. The conductive connecting material connects the light emitting element to the wire. The first holding member is arranged on an opposite side surface to a surface of a side of the substrate on which the light emitting element is mounted. The first holding member surrounds a region corresponding to a region on the substrate including the light emitting element and the conductive connecting material in a plan view. The first holding member is arranged adjacent to the wire. The first holding member includes an inner region arranged on an inner side of the first holding member, and having higher rigidity than rigidity of the flexible base, and an outer region arranged adjacent to the inner region outside the inner region, and having lower rigidity than rigidity of the inner region.

With the embodiments of the present invention, it is possible to improve the connection reliability between the light emitting element and the wire.

DETAIL DESCRIPTION OF EMBODIMENTS

Following, embodiments of this disclosure are explained while referring to drawings as appropriate. Note that the light emitting device explained hereafter is for explaining the technical concepts of this disclosure, and unless specifically noted, this disclosure is not limited to the items below. Also, the contents explained for one embodiment and the working examples are also applicable to other embodiments and working examples.

First Embodiment

Figure 1:
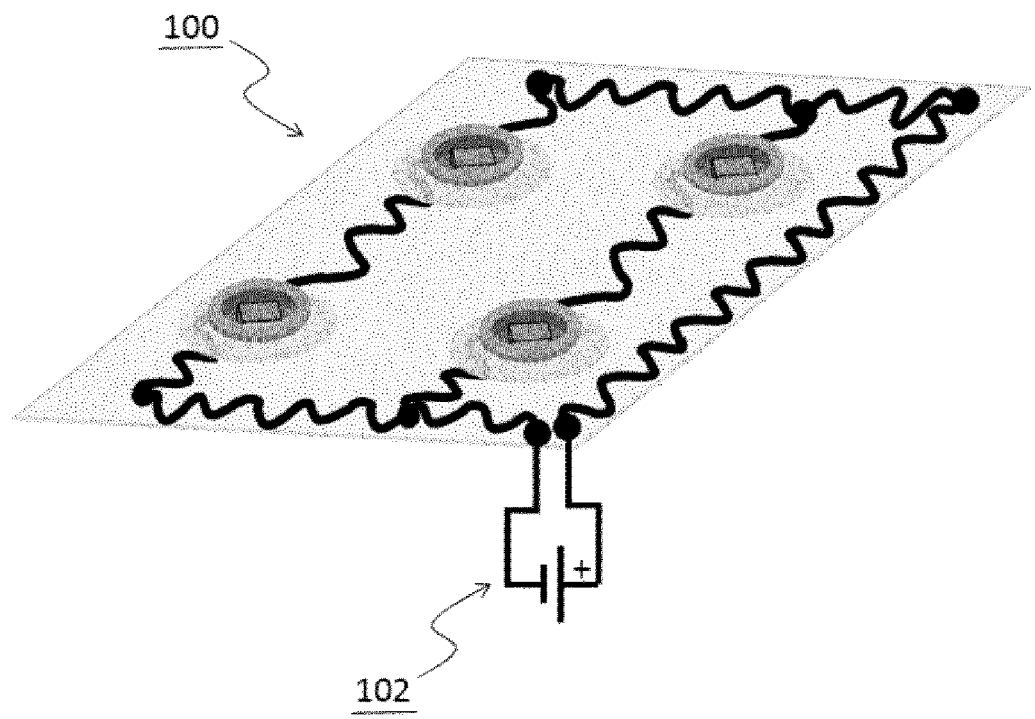
FIG. 1 is a schematic perspective view showing an example of a light emitting device of the first embodiment.
Figure 2A:
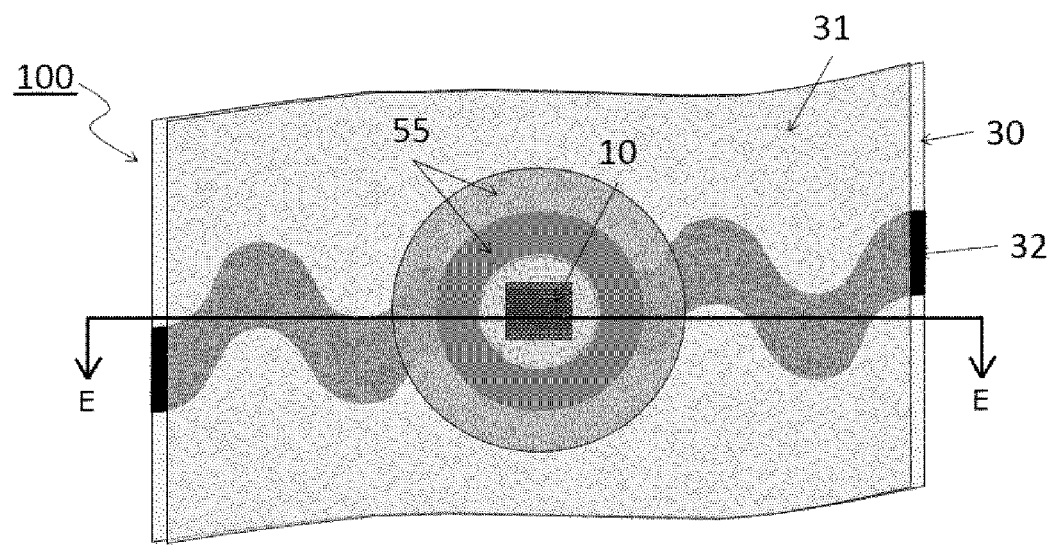
FIG. 2A is a schematic top view of the light emitting device of the first embodiment.

FIG. 1 is a schematic perspective view showing an example of a first embodiment of a light emitting device 100 of this disclosure. FIG. 2A is a schematic top view showing a part of the light emitting device 100 of this disclosure, and FIG. 2B is a schematic cross section view of line E-E of FIG. 2A.

Figure 2B:
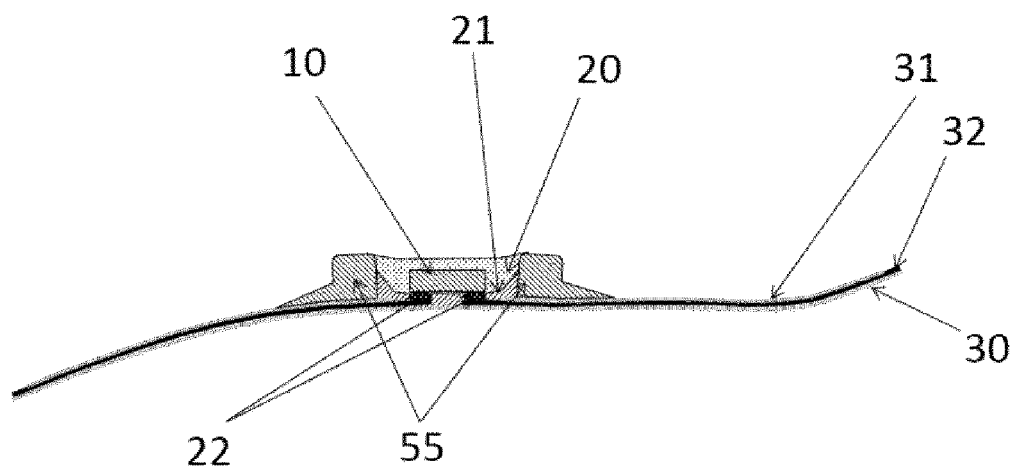
FIG. 2B is a schematic cross section view of line E-E of the light emitting device shown in FIG. 2A.

As shown in FIG. 2A and FIG. 2B, the light emitting device 100 of this embodiment has a flexible substrate 36 for which a wire 32 is arranged on a base 30 having both insulation properties and flexibility, a light emitting element 10 mounted on the substrate 36, and a conductive connecting material 22 for connecting the light emitting element 10 to the wire 32.

Also, the light emitting device 100 has a holding member 55 that surrounds a region on the substrate 36 including the light emitting element 10 and the conductive connecting material 22, and that is arranged adjacent to the wire 32 on the wire 32 with an insulating resin film 31 interposed. The holding member 55 has a first region having higher value of stress required for elastic deformation than that of the substrate 36 (hereinafter "value of stress required for elastic deformation" is called "rigidity"). Furthermore, the light emitting device 100 has a second region that is arranged adjacent to the first region, outside the first region, and that has rigidity lower than the rigidity of the first region.

The material configuring the holding member 55 has higher tensile elastic modulus than tensile elastic modulus of the material configuring the base 30. Therefore, even during operation of the light emitting element 10, the region of the substrate 36 in which the holding member 55 is arranged needs to apply greater external force to obtain the same deformation amount as that of the region with only the substrate 36. Furthermore, the holding member 55 has a first region on the inside, and a second region adjacent to the first region on the outside. The first region has higher rigidity than rigidity of the substrate 36. The second region has lower rigidity than the rigidity of the first region by having a different shape or material from the first region.

The holding member 55 may be one integrated member or may be configured by a plurality of two or more members. Specifically, the first region and the second region may be provided with one member, or a first member corresponding to the first region and a second member corresponding to the second region may be provided as two members. Following is explained an example of this embodiment for which the first region of the holding member 55 is configured by a first member 50, and the second region is configured by a second member 60, while referring to FIG. 2C and FIG. 2D. FIG. 2D is a cross section view of line A-A of FIG. 2C.

The base 30 may be provided not only with flexibility but also with elasticity. The base 30 is an insulating member comprising a film body such as a polyimide film, etc., or a cloth or knit fabric (including a net body) such as a woven fabric etc. comprising a natural fiber, synthetic fiber or the like, or it may also be a composite member for which a conductive film or fiber surface is covered by an insulating member. Specifically, the base 30 is a base comprising a member for which at least the surface is insulated, provided with bendability and inextensibility, or bendability and extensibility.

The wire 32 includes, for example, metal foil, metal wire, conductive fiber, conductive resin, a sintered compact of electrically conductive paste, and other conductive materials, and is arranged on top of the base 30 (or below, or inside). The wire 32 (except for a prescribed connection location with the power supply, various circuit elements, measuring equipment or the like) may be sandwiched by the base 30 and the insulating resin film 31, and the periphery of the wire 32 may also be wrapped by the insulating member of the base 30, the insulating resin film 31 or the like.

The insulating member such as the insulating resin film 31, etc. for covering the wire 32 ensures protection of the wire 32 and insulation with the wire 32 to which voltage is applied during operation of the light emitting device 100. The insulating resin film 31 is a film or coating material comprising an organic material film such as solder resist, polyimide film, enamel coating or the like, or an inorganic material film such as aluminum oxide film, silicon oxide film or the like. The insulating member such as the insulating resin film 31 for covering the wire 32 is formed on the wire surface by adhesion, coating, deposition, or other methods. When there is risk of degradation such as oxidation or the like to the wire 32 due to the effect of the atmosphere, etc., the insulating resin film 31 is preferably provided together with gas barrier performance in addition to the insulating property.

The substrate 36 includes the base 30, the wire 32, and the insulating resin film 31 for covering the wire 32, etc. as constituent members. The substrate 36 is, for example, a composite of a flexible substrate (flexi substrate, also called FPC), an electric wire with insulation coating film, a stretchable resin film with a wire pattern, an insulating woven fabric, which includes net body and knit fabric, and an electric wire with insulation coating film, etc. The substrate 36 not only has a flat upper and lower surface, but may also be an item with an uneven structure on the upper surface and lower surface.

The light emitting element 10 is a semiconductor light emitting element, such as an LED element (also called an LED chip), a light emitting transistor, or the like, for example.

The conductive connecting material 22 is, for example, various types of solder, an electrically conductive adhesive (in specific terms, silver paste, anisotropic conductive paste (ACP), etc.), a gold plated bump, a ball bump, gold wire, etc.

The first member 50 has higher rigidity than the rigidity of the substrate 36, and to obtain the same deformation amount as the substrate 36, it is necessary to apply greater external force even during operation of the light emitting element 10.

Here, "rigidity" indicates the insusceptibility to deformation in relation to bending or pulling force, and is expressed by the force (load÷deformation amount) required to cause unit deformation (bending or pulling). A comparison of the rigidity of members is performed by comparing the size of the force necessary to cause deformation of the same amount range that may be regarded as elastic deformation for the members being compared. The rigidity becomes higher by using a material with a large elastic modulus such as Young's modulus (tensile elastic modulus), and when the plate thickness may be varied, even with the same material, the rigidity becomes higher by making the plate thickness thicker or the like. With a composite material as well, the rigidity is compared by the size of the force (load÷deformation amount) required to cause unit deformation (bending or pulling). For example, with a bending test, in conformity with JIS K7171, the rigidity may be compared by finding the stress when the bending distortion is 0.05% and 0.25%.

The first member 50 is comprised of a metal, resin material, or a composite member of these. The resin material may contain inorganic material particle form and/or fibrous filler material (also called "filler"). For example, it is possible to use a metal member, an epoxy resin, a resin member of polycarbonate resin, etc., or transparent glass, etc.

In the plan view, the external dimension of the first member 50 is greater than the external dimension of the light emitting element 10, and has the external dimension of approximately the region of substrate 36 for which there is a marked decrease in rigidity with temperature rise due to operation of the light emitting element 10. For example, in the plan view, when the light emitting element 10 is mounted on the substrate 36, and the light emitting element 10 is operated at maximum output, it is preferable that the external dimension of the first member 50 have the size of the region of the substrate 36 surrounding the light emitting element 10 and the region of the substrate 36 for which the temperature rises 10° C. or more than the peripheral region of the substrate 36. Specifically, it is preferable that the first member 50 be disposed in a region for which there is a marked decrease in rigidity due to temperature rise.

The first member 50 is joined to the members configuring the substrate 36 such as the base 30, the insulating resin film 31, or the insulating film of the electric wire with insulation coating film, etc. For joining, it is possible to use adhesion, fitting, molding, potting, plating, impregnation, or other methods, and when necessary, it is possible to implement surface preparation before joining as appropriate. The joining member is selected as appropriate to match the material of the first member 50 and the members constituting the substrate 36 subject to joining.

The first member 50 is formed on the substrate 36 so as to surround a prescribed region including the light emitting element 10 and the conductive connecting material 22. Here, "surround" may mean a frame shape arranged in a ring shape without gaps on the substrate 36 around the light emitting element 10 (see FIG. 2C), or may also mean a dome shape with the region on which the light emitting element 10 is mounted as the center (e.g. a hard transparent lens provided with a recess in FIG. 9, etc.). With the first member 50, by the substrate 36 around the light emitting element 10 being made less susceptible to deformation even during operation of the light emitting device, the reliability of the electrical connection between the light emitting element 10 and the conductive connecting material 22 is improved.

The second member 60 is arranged adjacent to the first member 50, outside the first member 50. It is preferable that the external dimension of the second member 60 be greater than the external dimension of the first member 50, and that it have a size of no less than approximately the dimension of the region of the substrate 36 surrounding the light emitting element 10 for which there is more of a temperature rise (5° C. or greater, for example) than the peripheral region of the substrate 36 when the light emitting element 10 is mounted on the substrate 36 and the light emitting element 10 operates at maximum output, while it is preferable that the external dimension of the second member 60 be a size that does not reach the region of the substrate 36 in which a temperature rise is not seen. The lower limit of the difference between the external dimension of the second member 60 and the external dimension of the first member 50 depends on the necessary bendability resistance, the thickness of the wire 32, etc., and is 0.5 mm or greater, for example. As shown in FIG. 2D, for example, the second member 60 may be a resin ring for which the thickness decreases as it separates from the first member 50. The second member 60 may also be formed as an integrated member with the same material as the first member 50. This may also be a slitted resin body, a resin ring for which the filler concentration decreases as it separates from the first member 50, a resin ring for which the filler type changes and the rigidity decreases as it separates from the first member 50, or the like.

Specific examples of the material of the second member 60 include a silicone-based resin material with suitable addition of silicon oxide, titanium oxide, zinc oxide, aluminum nitride, boron nitride, carbon nanotubes or other fillers, or a urethane-based or other resin materials. The material properties, shape, dimensions, and quantity of the filler added to the resin is decided as appropriate considering the desired mechanical strength, thermal conductivity, thermal expandability, light transmissivity, electrical conductivity, affinity with resin, formability, and other functionality. For forming of the second member 60 and joining to the first member 50, which may include joining with the substrate 36, adhesion, molding, potting, caulking, coating, or other methods may be used. The forming and joining method are selected as appropriate to match the material of the first member 50 and the second member 60. The second member 60 on the outside of the first member 50 is provided on the substrate 36 (or below, or above and below), and covers the wire 32, or, is arranged on the substrate 36 (or below, or above and below) near the wire 32. Specifically, it is arranged adjacent to the wire 32.

Figure 2C:
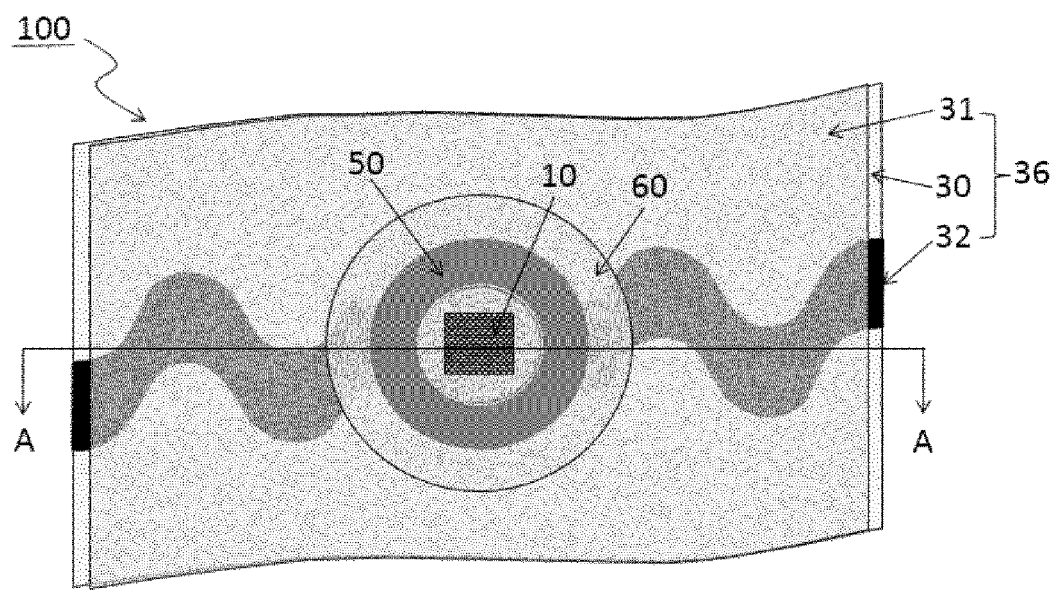
FIG. 2C is a schematic top view of the light emitting device of the first embodiment.
Figure 2D:
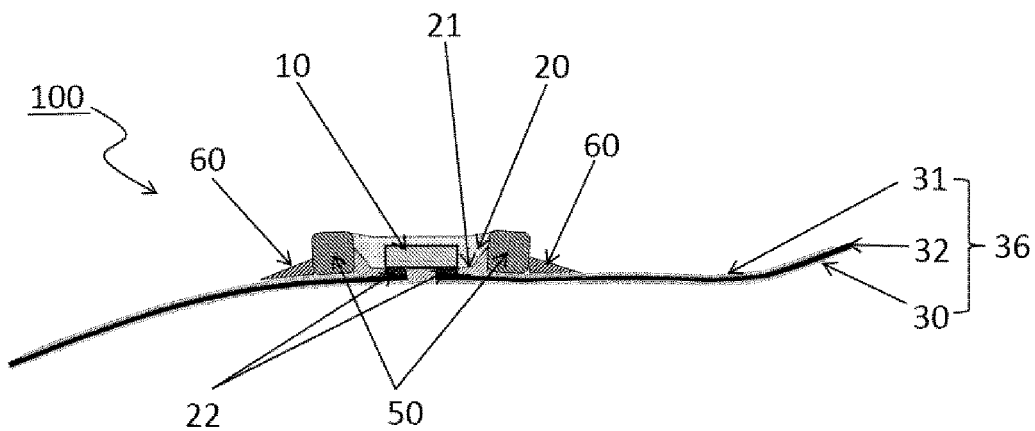
FIG. 2D is a schematic cross section view of line A-A of the light emitting device shown in FIG. 2C.
Figure 8A:
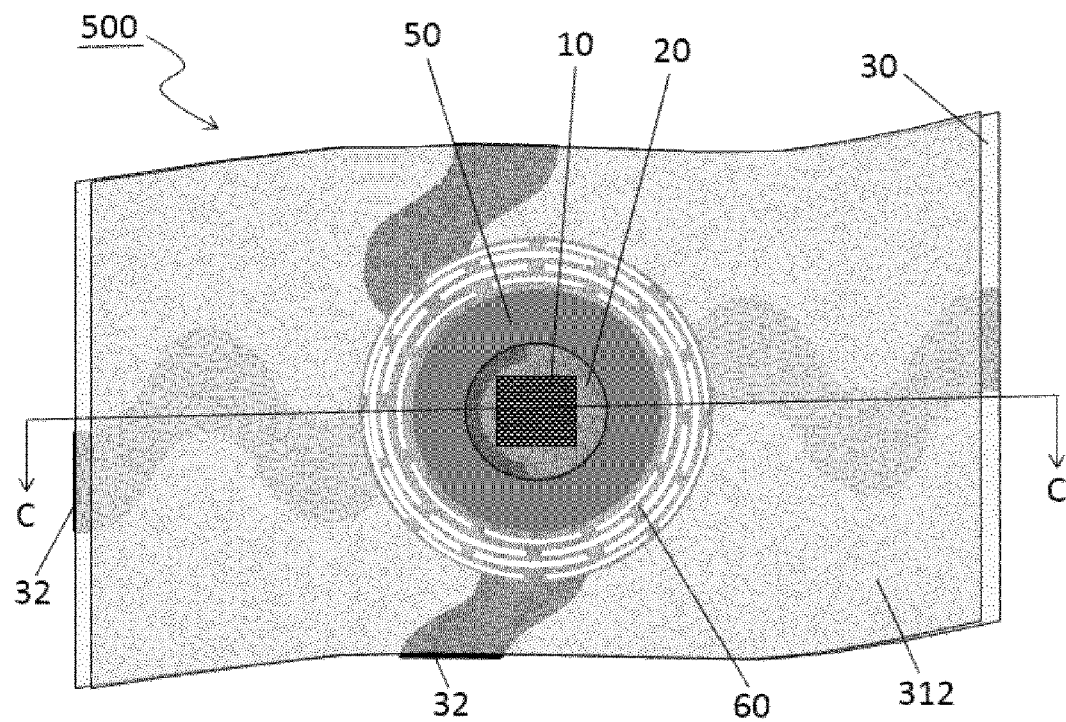
FIG. 8A is a schematic top view of the light emitting device of a fifth embodiment.
Figure 8B:
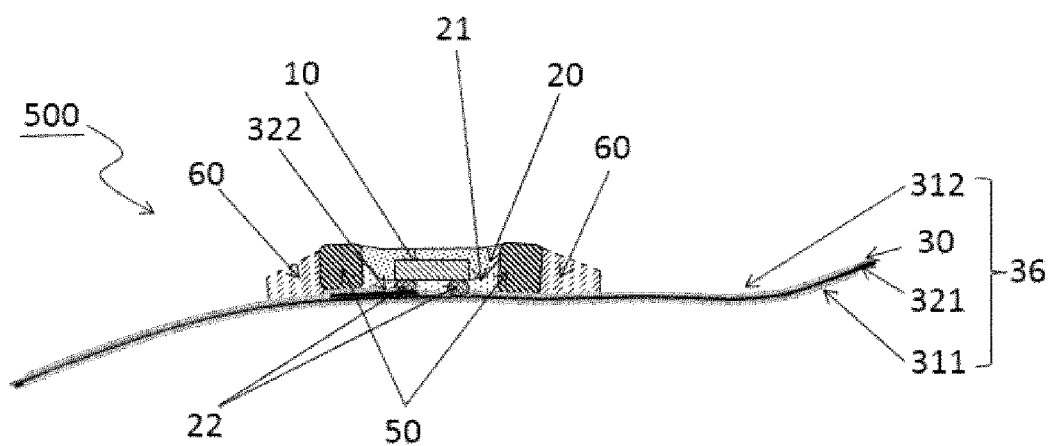
FIG. 8B is a schematic cross section view of line C-C of the light emitting device shown in FIG. 8A.
Figure 8C:
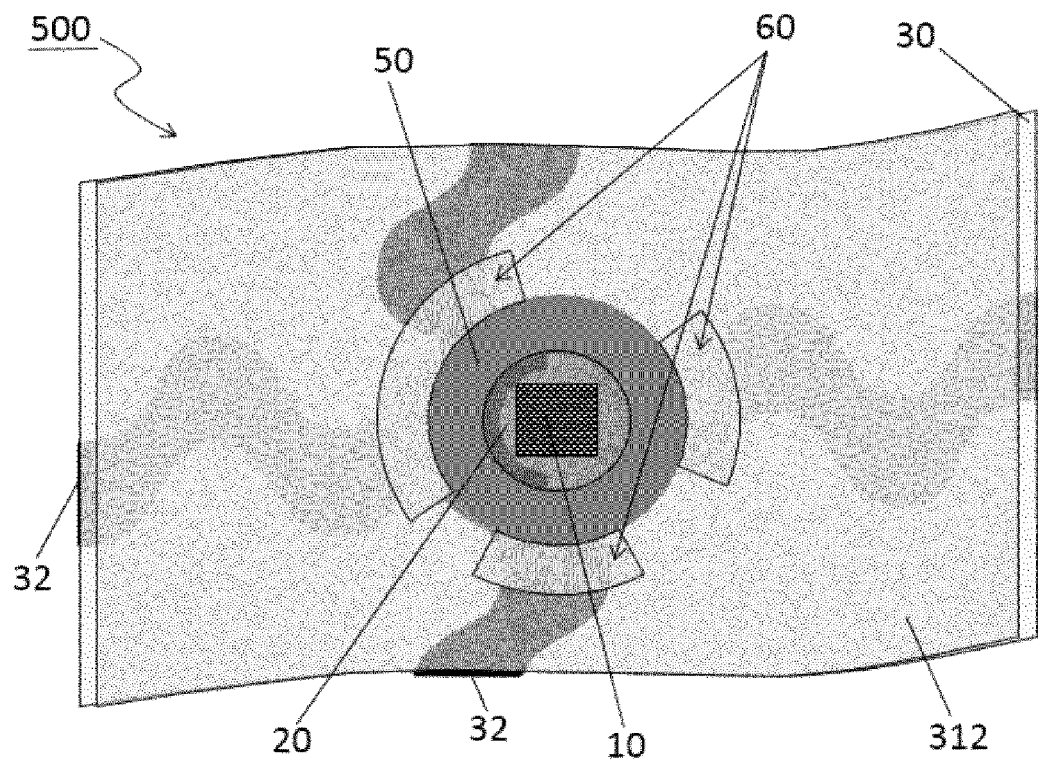
FIG. 8C is a schematic top view of another light emitting device of the fifth embodiment.

For example as shown in FIG. 2C, the second member 60 may be arranged without gaps on the substrate 36 around the light emitting element 10, or as shown in FIG. 8C, it may also be arranged intermittently around the light emitting element including on the wire (or below, or above and below). With the example in FIG. 8C, a plurality of second members 60 are arranged so as to be separated from each other.

The second member 60 may be joined with the insulating resin film 31 that covers the wire 32, or may also be not joined, and be adhered only to the base 30 near the wire 32 (or the insulating resin film 31 on the base 30).

The joining force of the second member 60 and the substrate 36 needs to be greater than the stress during deformation of each member which is an elastic body (the force for resisting in order for the elastic body to hold the original form), so as necessary, it is possible to implement surface preparation such as primer coating, etc. on a prescribed junction surface of the base 30 (or the insulating resin film 31 on the base 30).

The rigidity of the region on which the second member 60 is provided (the rigidity of the composite member including the substrate 36 and the second member 60) is lower than the rigidity of the region in which the first member 50 is provided (the rigidity of the composite member including the substrate 36 and the first member 50), and has rigidity that is the same or greater than the rigidity of the substrate 36 alone. As a result, the deformation amount of the substrate 36 on which the first member 50 is arranged and the wire 32 at its peripheral edge due to deformation of the substrate 36 when external force is applied is lessened, wire breakage of the wire 32 is suppressed, and the reliability of the electrical connection is improved.

So that the deformation changes smoothly when external force is applied, and bending does not occur due to local stress concentration on the substrate 36, the rigidity of the region in which the second member 60 is provided (the rigidity of the composite member including the substrate 36 and the second member 60) preferably becomes continuously higher as it approaches the region in which the first member 50 is provided, from the rigidity of the substrate 36 alone up to the rigidity of the region in which the first member 50 is provided (the rigidity of the composite member including the substrate 36 and the first member 50).

Joining force between the first member 50 and the second member 60 is preferably greater than joining force between the second member 60 and the base. This is because when the joining between the first member 50 and the second member 60 is eliminated, the deformation amount of the wire at the boundary line is susceptible to rapid increase, and there is a decrease in the effect for preventing wire breakage. The joining force may be measured using a tension test.

Figure 3:
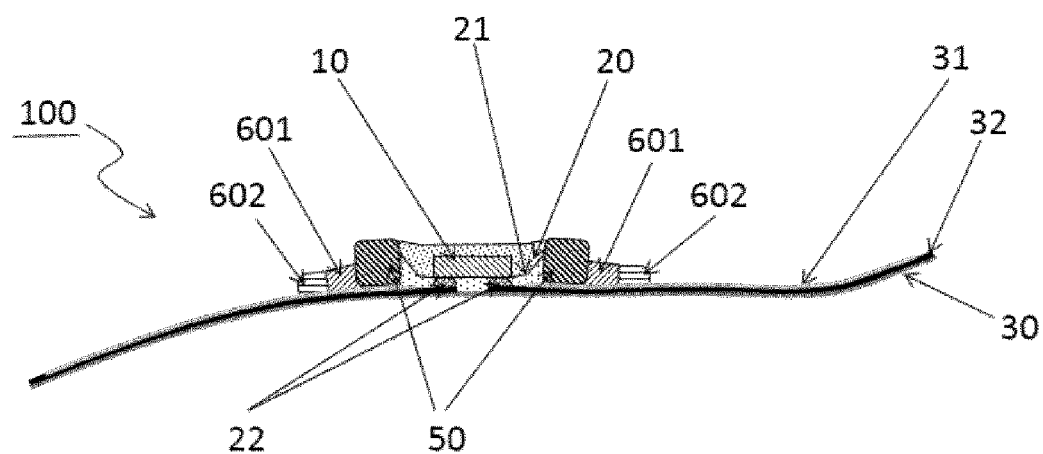
FIG. 3 is a schematic cross section view showing an example of the light emitting device of the first embodiment.
Figure 4:
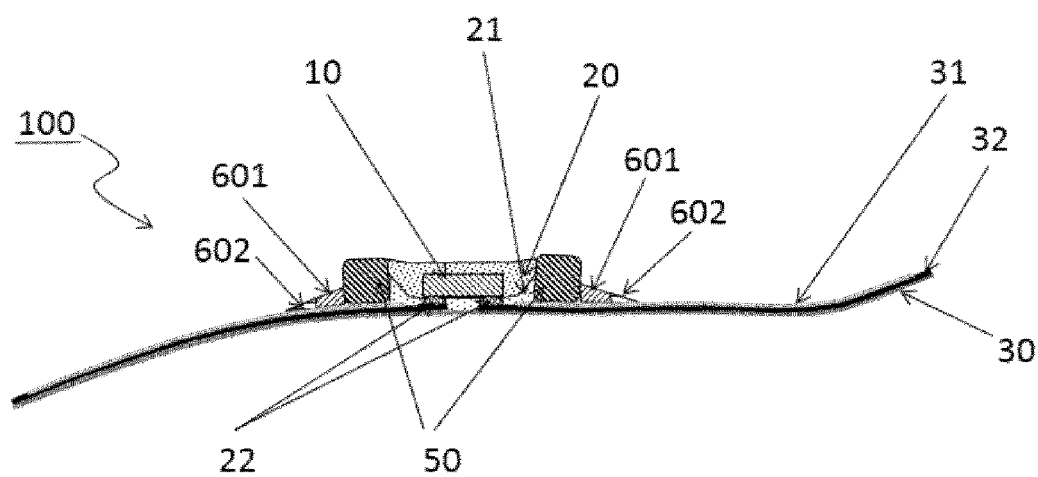
FIG. 4 is a schematic cross section view showing an example of the light emitting device of the first embodiment.

The second member 60 may also have two or more regions with different materials or shapes. In specific terms, as shown in FIG. 3 and FIG. 4, the second member 60 has a first region 601 arranged at the side near the first member 50, and a second region 602 arranged at the side further away from the first member 50 than the first region 601. The second region 602 is preferably set to have lower rigidity than the first region 601.

Thus, when filling the second member 60 with filler, for example, by changing the filling ratio of the filler contained by the first region 601 and the second region 602, or by having different types of filler, it is possible make the rigidity of the second region 602 lower than the rigidity of the first region 601.

Also, by forming the thickness of the second region 602 to be thinner than that of the first region 601, it is possible to make the rigidity of the second region 602 lower than the rigidity of the first region 601. Also, combining this kind of shape and material properties, it is possible to lower the rigidity of the resin of the second member 60 as it becomes more distant from the first member 50.

In this way, by changing the shape and material properties of the second member 60 at the near side and the far side from the first member 50 to lower the rigidity of the second member 60 as it goes farther away from the first member 50, it is possible to lessen the deformation amount of the substrate 36 on which the first member 50 is arranged and the wire 32 at its peripheral edge due to deformation of the substrate 36 when external force is applied, suppressing wire breakage, and to improve the reliability of the electrical connection.

An underfill 21 and transmissive sealing member 20 are filled in the region surrounded by the frame shaped first member 50 that surrounds the periphery of the light emitting element 10.

The underfill 21 is provided at least between the light emitting element 10 and the substrate 36. The underfill 21 is preferably formed using a light reflective resin. By using a light reflective resin, it is possible to reflect light emitted to the downward direction of the light emitting element 10, making it possible to increase light flux.

The underfill 21 may be formed using a silicone resin composition, a modified silicone resin composition, an epoxy resin composition, a modified epoxy resin composition, an acrylic resin composition, or the like, silicone resin, epoxy resin, urea resin, fluororesin, or a hybrid resin containing at least one or more types of these resins, for example, and a light reflective substance. Among these, resins containing silicone resin, epoxy resin or the like as the base polymer are preferable.

The light reflective substance includes titanium oxide, silicon oxide, zirconium oxide, magnesium oxide, calcium carbonate, calcium hydroxide, calcium silicate, zinc oxide, barium titanate, potassium titanate, alumina, aluminum nitride, boron nitride, mullite and the like. This makes it possible to reflect light with good efficiency. The material configuring the underfill 21 may be used alone or in combinations of two or more types. This makes it is possible to adjust the reflection rate of the light, and also possible to adjust the linear expansion coefficient of the resin.

The sealing member 20 covers the light emitting element 10, and has an electrical insulating property. The sealing member 20 is not particularly limited provided it is a material through which light emitted from the light emitting element 10 may be transmitted, and for example includes an inorganic material such as oxide glass or an organic material such as light transmissive resin. The transmittance of the sealing member is preferably 70% or greater. The light transmissive resin that can be the sealing member, includes, for example, silicone resin, silicone modified resin, epoxy resin, phenol resin, polycarbonate resin, acrylic resin, polymethyl pentene resin, polynorbornene resin, or a hybrid resin including one or more of these resins, or the like. Among these, silicone resin is preferable because it has excellent thermal resistance and light resistance, and has little volume shrinkage after solidifying. The sealing member 20 may also contain an additive that may convert the wavelength of the light emitted from the light emitting element 10, such as for example a wavelength conversion member such as phosphor, quantum dots, or the like, or a light diffusion material or the like.

Second Embodiment

Figure 5A:
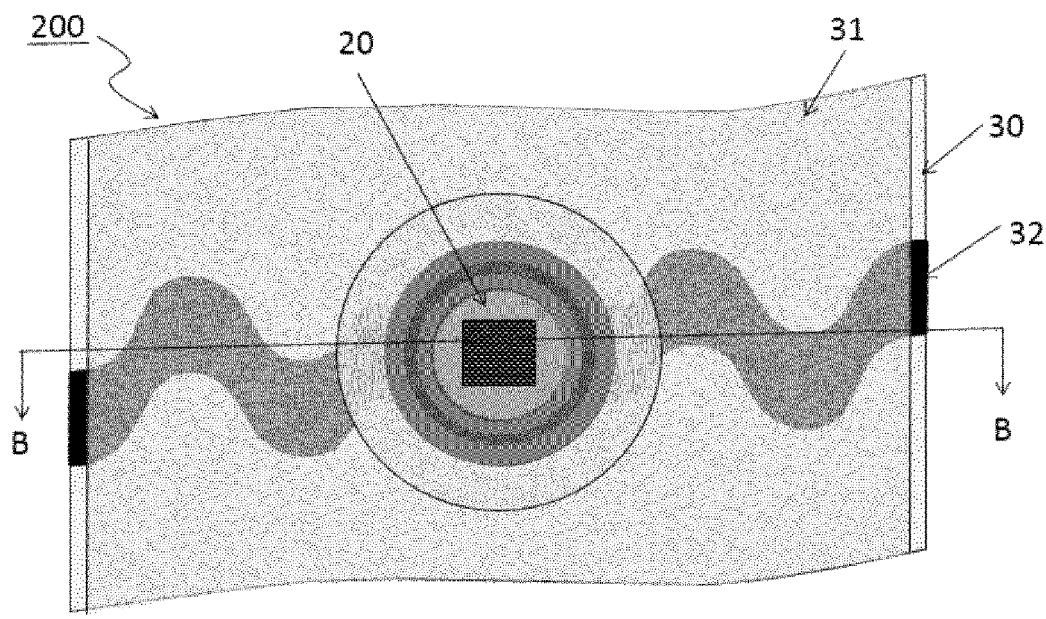
FIG. 5A is a schematic top view of the light emitting device of a second embodiment.
Figure 5B:
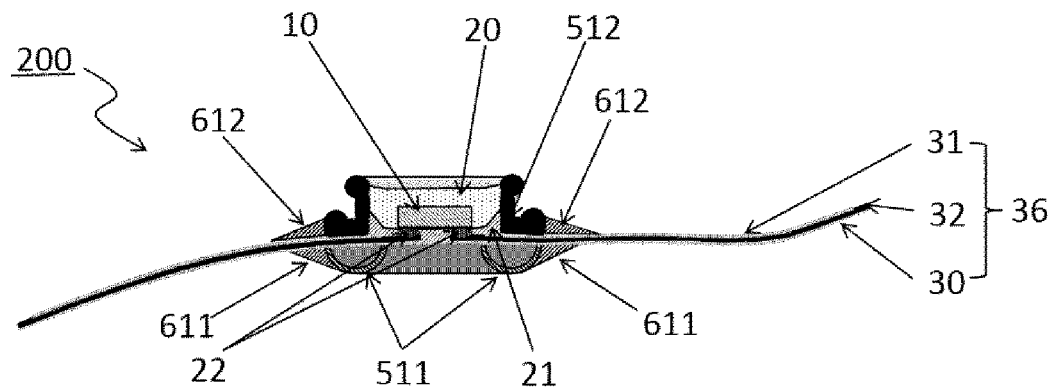
FIG. 5B is a schematic cross section view of line B-B of the light emitting device shown in FIG. 5A.

FIG. 5A is a schematic top view showing a light emitting device 200 of a second embodiment. FIG. 5B is a schematic cross section view of line B-B in FIG. 5A.

With this embodiment, there is a third member 511 (an inner member) that, at an opposite side surface to a surface of a side of the substrate 36 on which the light emitting element 10 is mounted, surrounds the region corresponding to a region on the substrate 36 including the light emitting element 10 and the conductive connecting material 22, and is arranged adjacent to the wire 32. The third member 511 is a member corresponding to the first member 50 of the first embodiment, and has the same material properties and dimensions, etc. as those of the abovementioned first member 50.

The third member 511 has greater rigidity than rigidity of the base 30. At the outside of the third member 511, arranged adjacent to the third member 511, there is a fourth member 611 (an outer member) having greater rigidity than the rigidity of the base 30 and smaller rigidity than rigidity of the third member 511. The fourth member 611 is a member corresponding to the second member 60 in the first embodiment, and has the same material properties and dimensions, etc. as those of the abovementioned second member 60. In FIG. 5A and FIG. 5B, the third member had a round ring shape in the plan view, but it may also be a frame shape of other shapes such as a polygon or the like, and is not limited to being a round ring shape.

The third member 511, the same as the first member 50 in the first embodiment, by having the substrate 36 around the light emitting element 10 be less susceptible to deformation, improves the reliability of the electrical connection between the light emitting element 10, the conductive connecting material 22, and the wire 32.

Furthermore, at the outside of the third member 511, arranged adjacent to the third member 511, is arranged a fourth member 611 having rigidity smaller than the rigidity of the third member 511. Thereby, the same as with the first embodiment, a third member 511 with a high rigidity material is provided in the vicinity of the light emitting element 10, and so that the stress outside the third member 511 is not applied to inside the third member 511, the low rigidity fourth member 611 is provided outside the high rigidity third member 511, so deformation of the substrate 36 at the outer edge of the third member 511 is lessened.

Accordingly, there is a marked reduction in stress load on the conductive connecting material 22 that electrically connects the light emitting element 10 to the wire 32 on the base 30, suppressing the stress load on the wire 32 on the base 30 in the outside vicinity of the third member 511, preventing wire breakage of the wire 32 by gradually reducing the radius of curvature of the wire 32 when there is an external force load, thus improving connection reliability.

The third member 511 may be combined with a second holding member including the first member, and for example, as shown in FIG. 5B, in addition to on the lower side of the substrate 36, may also have the first member 512 arranged at the mounting surface side of the light emitting element 10 so as to cover the light emitting element and its periphery. In other words, it is possible to have the third member and the first member arranged at both the upper side and lower side of the substrate 36. Accordingly, it is possible to increase the effect of being less susceptible to deformation of the substrate 36 around the light emitting element 10.

With the embodiment noted above, the third member 511 and the fourth member 611 were separate members, but it is possible to have these be an integrated holding member (a first holding member) having a third region (an inner region) and a fourth region (an outer region).

At the light emitting element 10 mounting surface side of the substrate 36 as well, the same as with the lower side, arranged is the second holding member including a ring shaped first member 512, and a second member 612 arranged adjacent to the first member 512, having rigidity greater than rigidity of the substrate 36 and smaller than rigidity of the first member 512. The underfill 21 and the sealing member 20 are arranged in the region surrounded by the upper side first member 512.

Figure 5C:
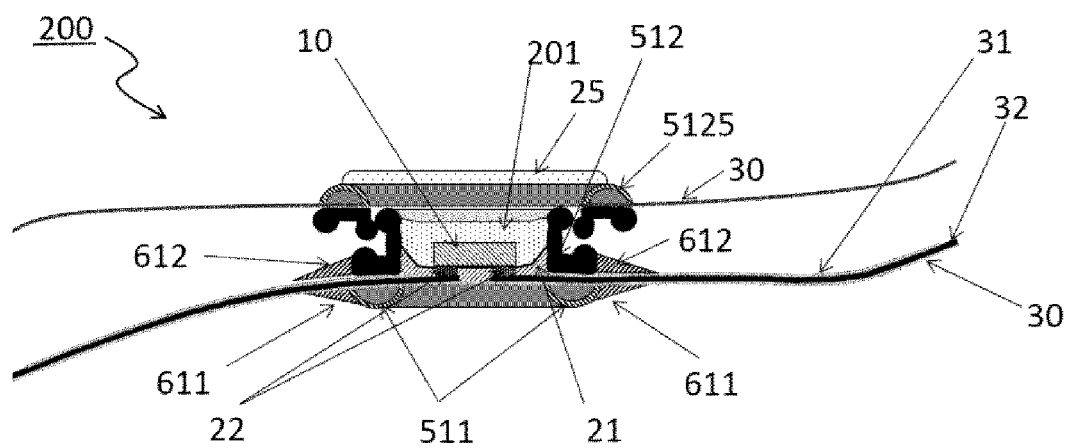
FIG. 5C is a schematic cross section view of another light emitting device of the second embodiment.

Furthermore, it is also possible to add a secondary lens or wavelength conversion member (cap, etc.) for covering the first member 512 on the side on which the light emitting element 10 is mounted. It is thereby possible to change to an item of the desired light distribution or wavelength. For example as shown in FIG. 5C, it is also possible to fit a female ring snap button provided with a wavelength conversion member 25 which is a phosphor-containing resin cap fit onto a male ring snap button which is the first member 512.

Third Embodiment

Figure 6:
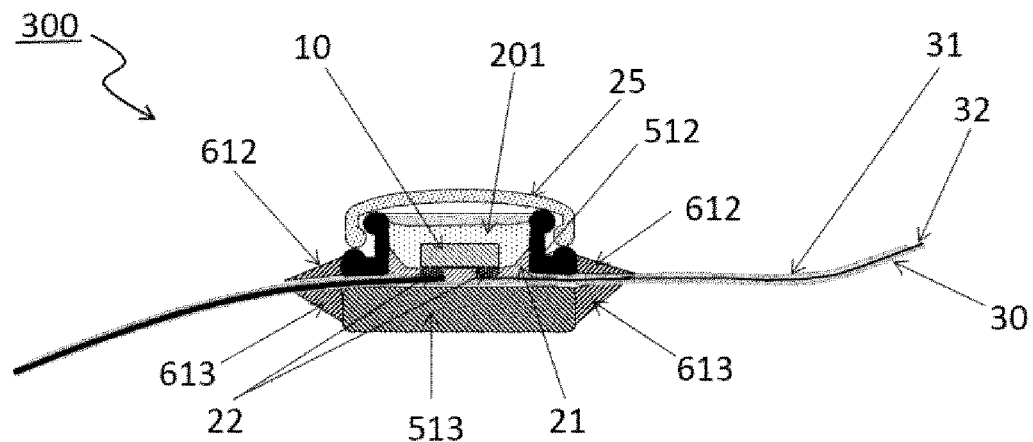
FIG. 6 is a schematic cross section view of the light emitting device of a third embodiment.

FIG. 6 is a schematic cross section view showing a light emitting device 300 of a third embodiment. At the opposite side surface to the side of the substrate 36 on which the light emitting element 10 is mounted, a disk-shaped fifth member 513 having rigidity greater than the rigidity of the base 30 is arranged in a region corresponding to the region in which the light emitting element 10 and the conductive connecting material 22 are arranged, in other words, on the lower surface side of the substrate 36. The fifth member 513 is a member correlating to the first member 50 in the first embodiment, and has the same material properties and dimensions, etc. as those of the abovementioned first member 50. The shape of the fifth member is not limited to being disk-shaped, and may also be other shapes such as a polygon, a radial form, etc.

Also, arranged at the outside of the fifth member 513 adjacent to the fifth member 513, a sixth member 613 having rigidity smaller than the rigidity of the fifth member 513 is arranged. The stress load to the wire 32 on the base 30 near the outside of the fifth member 513 is thereby suppressed, and by having the radius of curvature of the wire 32 change gradually when there is an external force load, wire breakage of the wire 32 is prevented, thus improving connection reliability. The sixth member 613 is a member correlating to the second member 60 of the first embodiment, and has the same material properties and dimensions, etc. as the abovementioned second member 60.

Furthermore, it is also possible to arrange the first member 512 and the second member 612 on the surface of the side of the substrate 36 on which the light emitting element 10 is mounted, to even further prevent wire breakage of the wire 32, and to improve connection reliability. It is also possible to add the wavelength conversion member 25 to the first member 512.

With this embodiment, by arranging the disk-shaped fifth member 513 directly under the light emitting element 10, it is possible to quickly discharge the heat emanated from the light emitting element 10. Also, in a case when there may be degradation due to absorption of light emitted from the light emitting element 10 with the base of the substrate 36 made of resin, it is possible to inhibit a temperature rise of the base directly below the light emitting element 10, and to suppress degradation thereof.

With the embodiment noted above, the fifth member 513 and the sixth member 613 are separate members, but it is also possible for these to be an integrated holding member having a fifth region and a sixth region.

Fourth Embodiment

Figure 7:
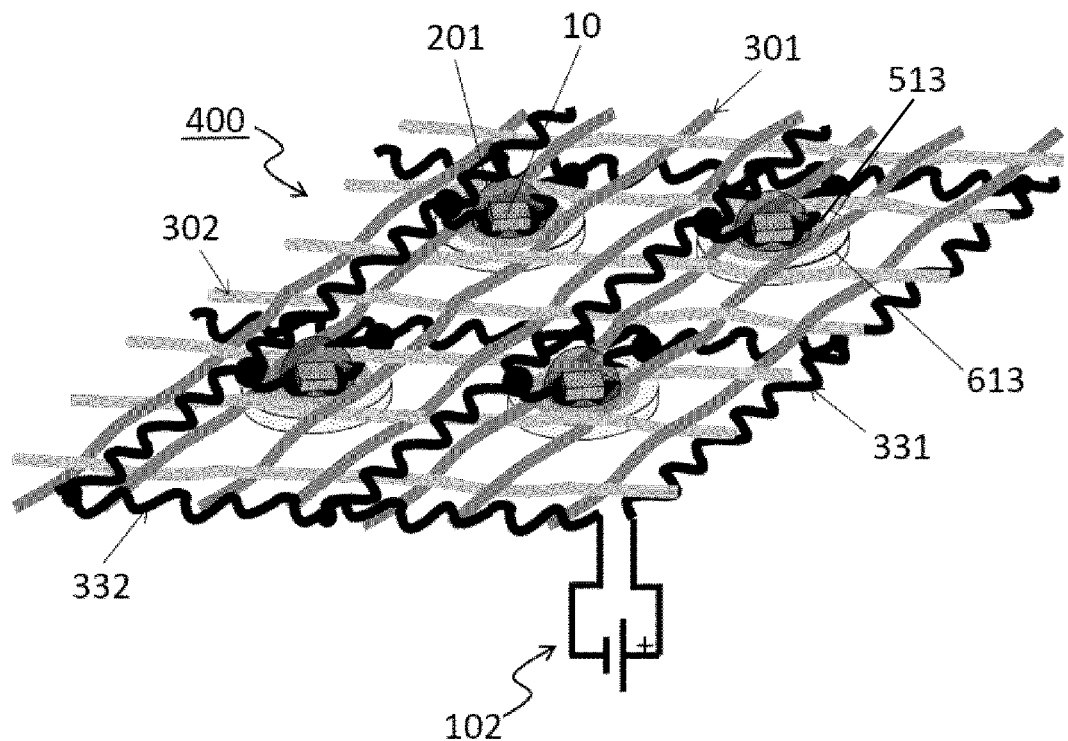
FIG. 7 is a schematic perspective view of the light emitting device of a fourth embodiment, and is a drawing applicable to parallel connected light emitting devices in a case when the base is woven fabric.

FIG. 7 is a schematic top view showing a light emitting device 400 of a fourth embodiment. As shown in FIG. 7, the substrate 36 may also be a composite of an insulating woven fabric, which includes a net body and knitted fabric, and an electric wire with an insulation coating film.

In FIG. 7, at the edge of the woven fabric, positive/negative wires (with an insulating coating) are respectively arranged along the warp thread 301 and the weft thread 302 of the woven fabric, and in the region other than the edge, a plurality of negative wires 331 (with an insulating coating) are arranged along the warp thread 301, and a plurality of positive wires 332 (with an insulating coating) are arranged along the weft thread 302, and four light emitting elements are connected in parallel to a power supply 102. Positive/negative wires (with an insulating coating) are arranged on the disk-shaped fifth member 513 and the sixth member 613 wound around this, and are connected to the light emitting element 10. The light emitting element 10 is covered by a sealing member. By using an insulating woven fabric, which includes net body and knitted fabric, as the substrate, the substrate has excellent flexibility and elasticity, expanding the application fields such as e-textiles, etc.

Fifth Embodiment

FIG. 8A is a schematic top view showing a light emitting device 500 of a fifth embodiment. FIG. 8B is a schematic cross section view of line C-C in FIG. 8A.

In FIG. 8A, FIG. 8B, and FIG. 8C, positive wires and negative wires are arranged so as to intersect in the light emitting element 10 mounting region at the top and bottom of a film-form flexible base 30.

With this embodiment, the second member 60 arranged adjacent to the first member 50 has a plurality of concentrically circular slits. As shown in FIG. 8A and FIG. 8B, by increasing the amount of the slit in the second member 60 as it goes further away from the first member 50, it is possible to lower the rigidity of the second member 60.

With this embodiment, the substrate 36 has insulating resin films 312, 311 formed on the upper surface and the lower surface.

Also, as shown in FIG. 8C, the second member 60 may also be arranged intermittently around the first member 50.

Sixth Embodiment

Figure 9:
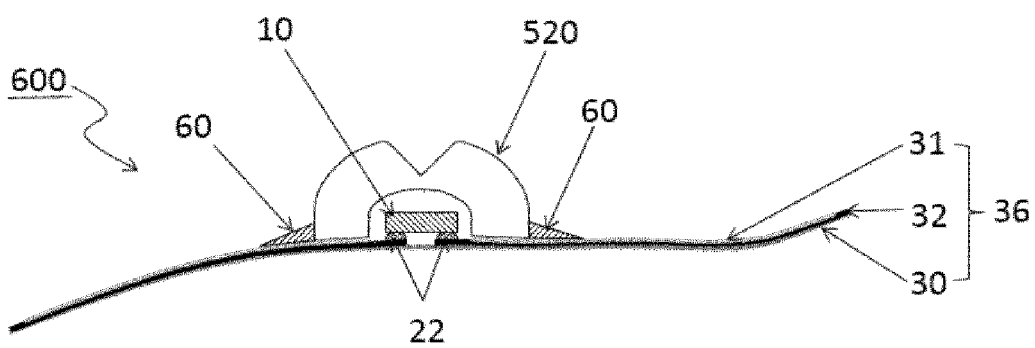
FIG. 9 is a schematic cross section view of the light emitting device of a sixth embodiment.

FIG. 9 is a schematic cross section view showing a light emitting device 600 of a sixth embodiment. With this embodiment, a first member 520 has a lens function. As shown in FIG. 9, the lens-shaped first member 502 is formed so as to cover the light emitting element 10. The lower surface of the first member 520 is ring shaped, the light emitting element 10 is arranged so as to be on the inside of the ring, and the lower surface is joined with the substrate 36. The lens shape may, for example, be a shape for which a hollow is provided at the center to expand the light distribution. The second member 60 is formed on the bottom of the side of the first member 520, in contact with the first member 520. The second member 60 may be light transmissive, or may be light reflective.

Seventh Embodiment

Figure 10:
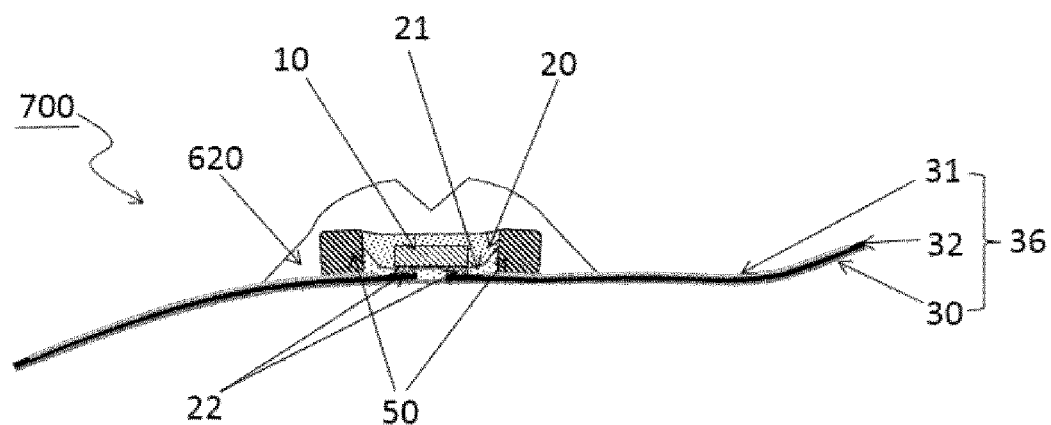
FIG. 10 is a schematic cross section view of the light emitting device of a seventh embodiment.

FIG. 10 is a schematic top view showing a light emitting device 700 of a seventh embodiment. With this embodiment, as shown in FIG. 10, a second member 620 has a lens function. The second member 620 is formed so as to coat the first member 50 and the underfill 21 or the sealing member 20 arranged inside the first member 50. By covering the first member 50 and the substrate 36, the same as with the first embodiment, the deformation amount of the substrate 36 and the wire 32 at its peripheral edge is lessened, suppressing wire breakage of the wire 32, making it possible to improve the reliability of the electrical connection.

Eighth Embodiment

Figure 11A:
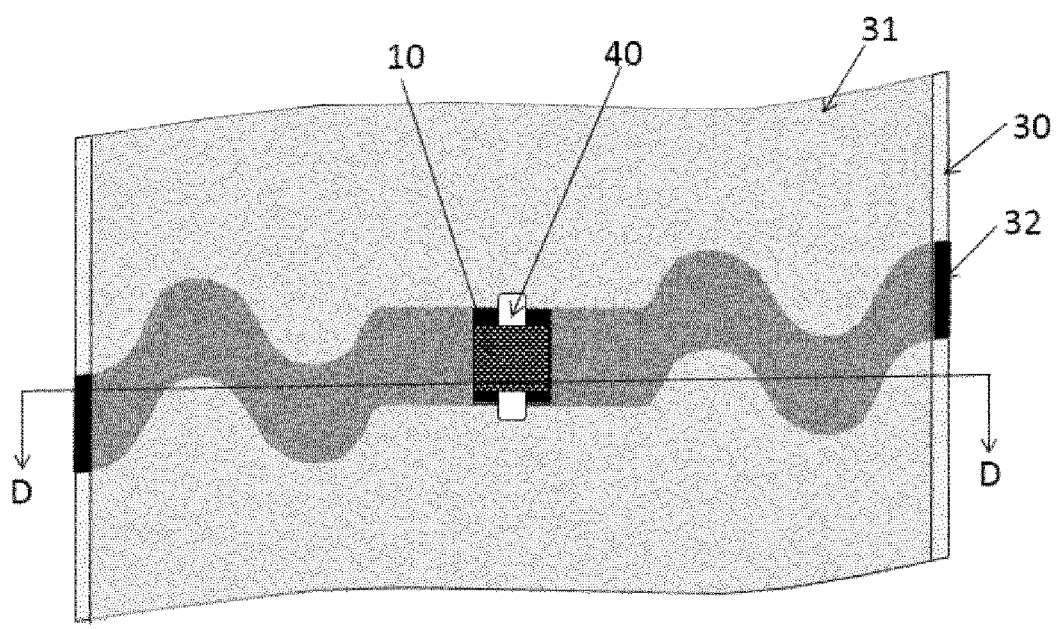
FIG. 11A is a schematic top view showing the manufacturing method of the light emitting device of an eighth embodiment.
Figure 11B:
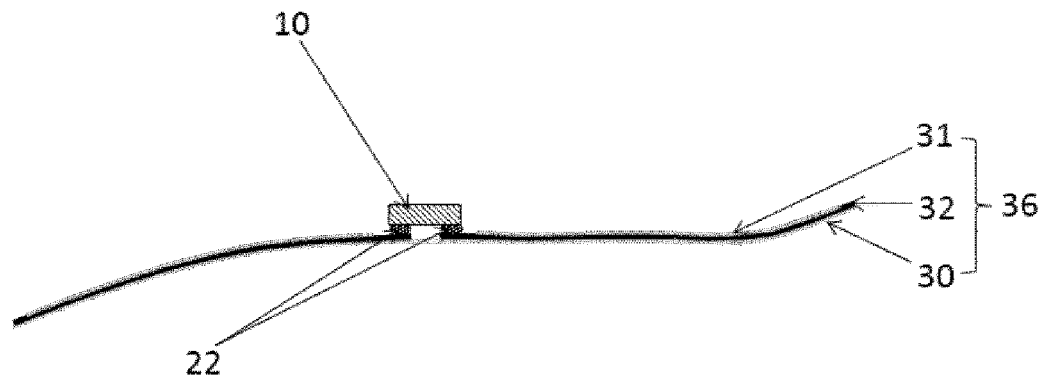
FIG. 11B is a schematic cross section view of line D-D of the light emitting device shown in FIG. 11A.
Figure 11C:
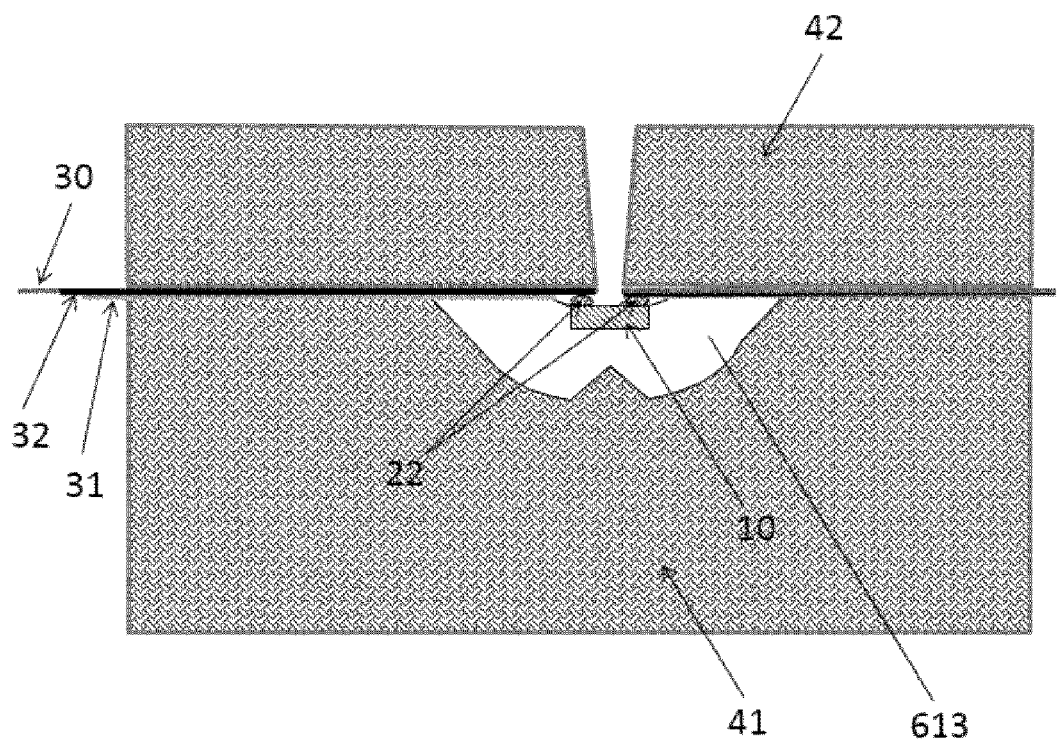
FIG. 11C is a schematic cross section view showing the manufacturing method of the light emitting device of the eighth embodiment.
Figure 11D:
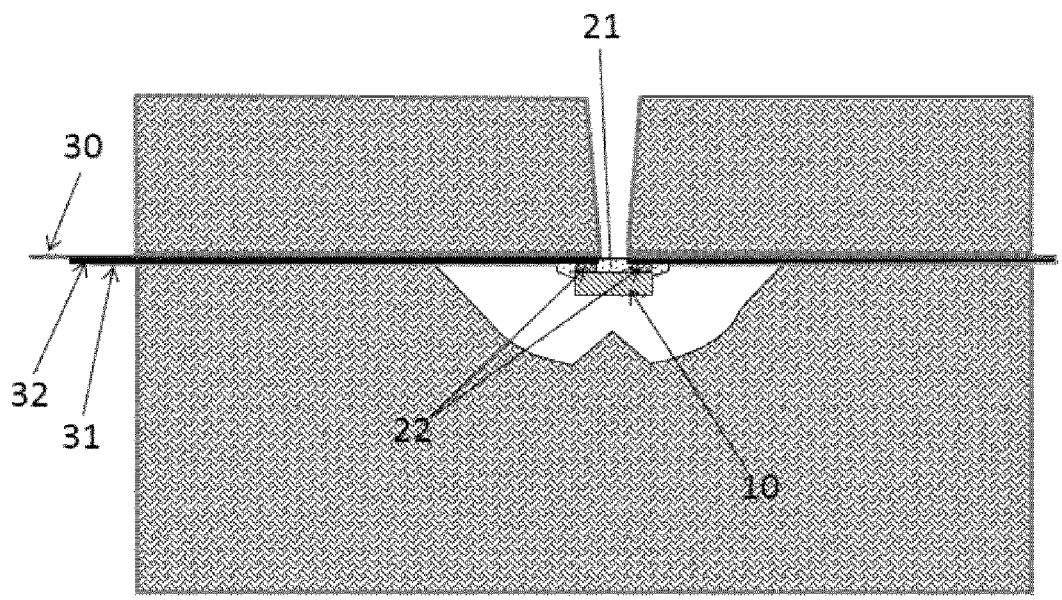
FIG. 11D is a schematic cross section view showing the manufacturing method of the light emitting device of the eighth embodiment.
Figure 11E:
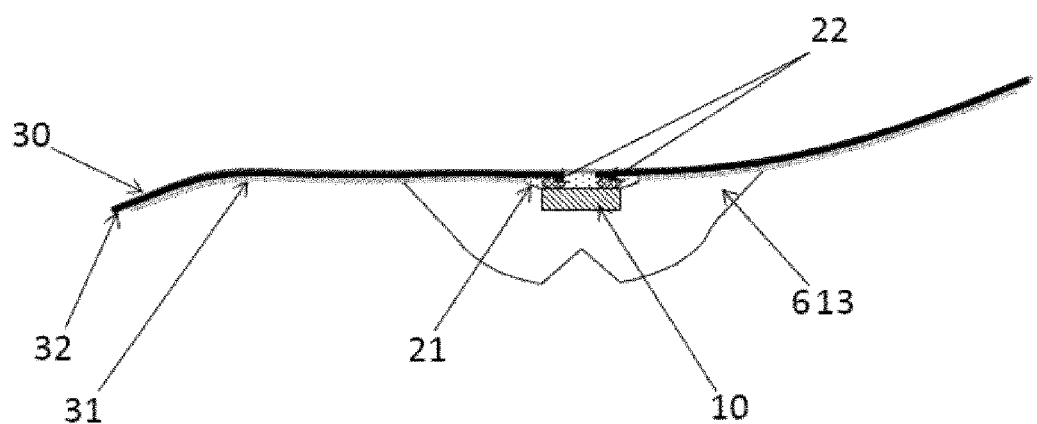
FIG. 11E is a schematic cross section view showing the manufacturing method of the light emitting device of the eighth embodiment.
Figure 11F:
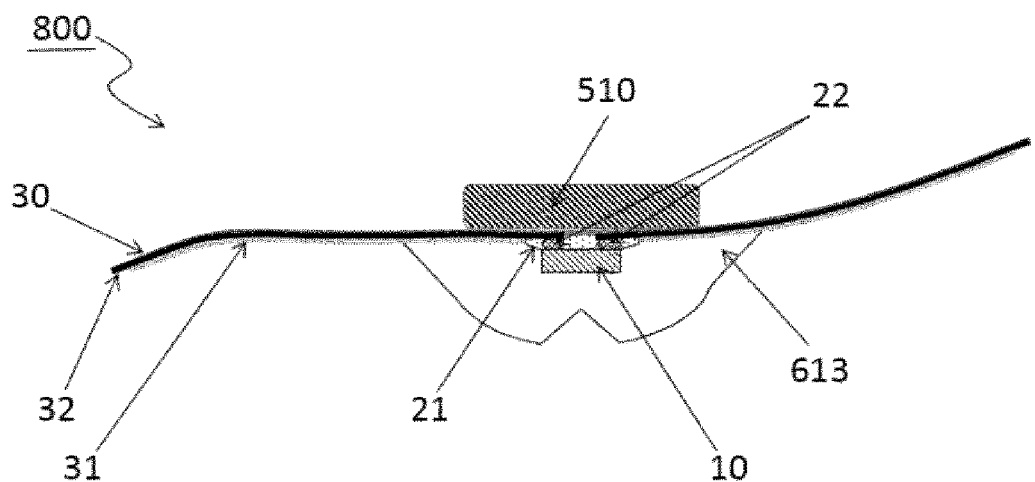
FIG. 11F is a schematic cross section view showing the manufacturing method of the light emitting device of the eighth embodiment.

FIG. 11F is a schematic cross section view showing a light emitting device 800 of an eighth embodiment. As shown in FIG. 11F, it is possible to provide a fifth member 510 and a sixth member 613 separately above and below the substrate, adjacent with the substrate 36 interposed. The external dimension of the sixth member 613 is greater than the external dimension of the fifth member 510, and the center (center of gravity) of the contact surface of the fifth member 510 and the substrate 36 almost matches the center (center of gravity) of the contact surface of the sixth member 613 and the substrate 36. The sixth member 613 is adjacent to the fifth member 510 with the substrate 36 interposed, and extends as far as the upper surface of the substrate of the outside of the outer edge of the fifth member 510. For example, the disk-shaped fifth member 510 is provided on the lower side of the light emitting element 10, which is the surface that is on the side opposite to the side of the substrate on which the light emitting element 10 is mounted, and as the sixth member 613, a sealing member also serving as a lens (made of silicon resin, for example) is formed to be larger than the external dimension of the fifth member 510, covering the light emitting element 10. The lens shape, to expand the light distribution, for example, may be a shape for which a hollow is provided at the center part. As a method for forming the sealing member also serving as a lens, for example, after mounting the light emitting element 10 on the substrate 36 for which a through hole is provided in the light emitting element 10 mounting region, this is sandwiched by a mold having a gap corresponding to the lens shape, and it is possible to do potting of the silicone resin in the gap and harden for formation.

Ninth Embodiment

Figure 12:
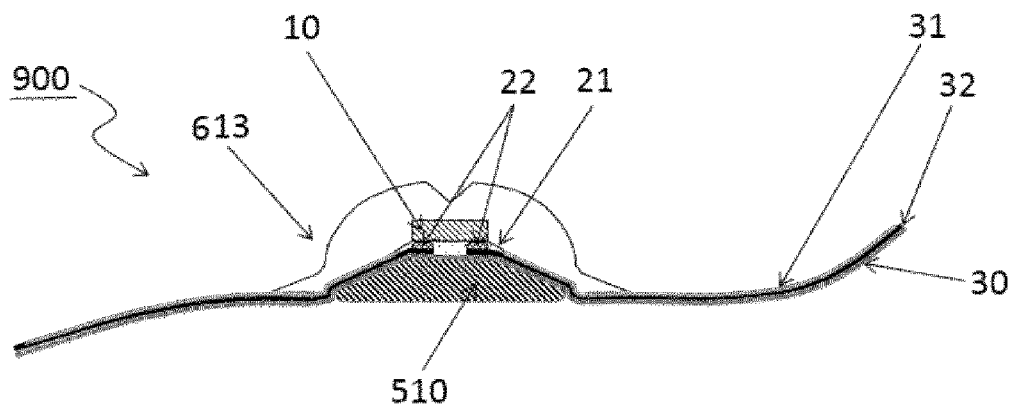
FIG. 12 is a schematic cross section view of the light emitting device of a ninth embodiment.

FIG. 12 is a schematic top view showing a light emitting device 900 of a ninth embodiment. In the case of a use method such as attaching the light emitting device to a base, or in a case of attaching to a flat reinforcing plate and passing through a reflow furnace, it is preferable that the lower surface of the substrate be flat. In light of that, using the flexibility (and elasticity) of the substrate 36, it is possible to curve the substrate as shown in FIG. 12 to form a recess, and to arrange the fifth member 510 in that recess. In that case, the sixth member 613 is adjacent to the outside of the fifth member 510 with the substrate 36 interposed. The lower surface of the light emitting device is flat, which is preferable for attachment to a base, etc.

Working Example 1

As working example 1, the light emitting device 200 shown in FIGS. 5A and 5B is fabricated as shown hereafter.

Using a 25 μm thick polyimide film (tensile elastic modulus 3.4 GPa for example) as the base 30, a 35 μm thick copper foil (tensile elastic modulus 110 GPa) that will be the wire 32 is stuck on that using an epoxy based adhesive, and after forming an electrical circuit pattern, with the insulating resin film 31 (a film thickness 15 μm titanium oxide-containing silicone based resin film, for example), the light emitting element mounting region on which the wire 32 electroless gold plating film (not shown) is implemented is removed, thus preparing a flexi substrate (Flexible Printed Circuit, FPC) covering the wire 32 as the substrate 36.

A solder paste (also called cream solder) which is the conductive connecting material 22 is arranged using a screen printing method, for example, on the region on the substrate 36 stuck to a reinforcing plate (not shown). In a case when the surface of the substrate 36 on which the light emitting element is mounted is flat, it is possible to perform coating of the paste-like conductive connecting material using this kind of screen printing method with good efficiency.

As the light emitting element 10, an LED chip (0.5 mm×0.5 mm×0.15 mm thick) that emits blue colored light, and has a pair of electrodes on one surface of the semiconductor surface laminated on a sapphire substrate (tensile elastic modulus 470 GPa), is mounted on the substrate 36 with the junction down with solder paste interposed, this is passed through a reflow furnace, and the LED chip is connected to a substrate wire (for example in the case of Sn—Ag—Cu, the tensile elastic modulus is 30 to 50 GPa). After that, the reinforcing plate is removed.

Figure 13A:
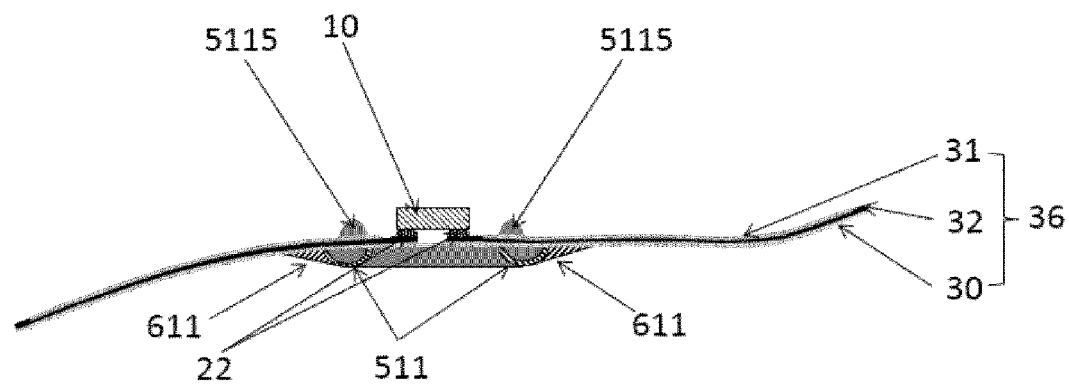
FIG. 13A is a schematic cross section view for explaining the manufacturing method of the light emitting device of working example 1.

The frame body includes the third member 511 and the fourth member 611 positioned on the substrate lower side. The third member 511 includes a ring (for example, made of ⁶⁄₄ brass at plate thickness 0.2 mm (tensile elastic modulus 103 GPa), an outer diameter 10 mm, an inner diameter 7 mm), provided with claws corresponding to a male ring snap button having an outer diameter of 11 mm and an inner diameter of 1.5 mm and having a through hole in the center. The fourth member 611 is arranged to surround the outer periphery of the third member 511. The fourth member 611 has an outer diameter of 20 mm, has a wedge-shaped cross section shape and includes silicone based resin (tensile elastic modulus 1.4 MPa). The third member 511 and the fourth member 611 are joined such that the claw members pierce through the periphery of the LED chip mounting location of the substrate 36 facing from the lower surface toward the upper surface. Thereby, the claw members 5115 are arranged around the light emitting element 10 as shown in FIG. 13A.

Figure 13B:
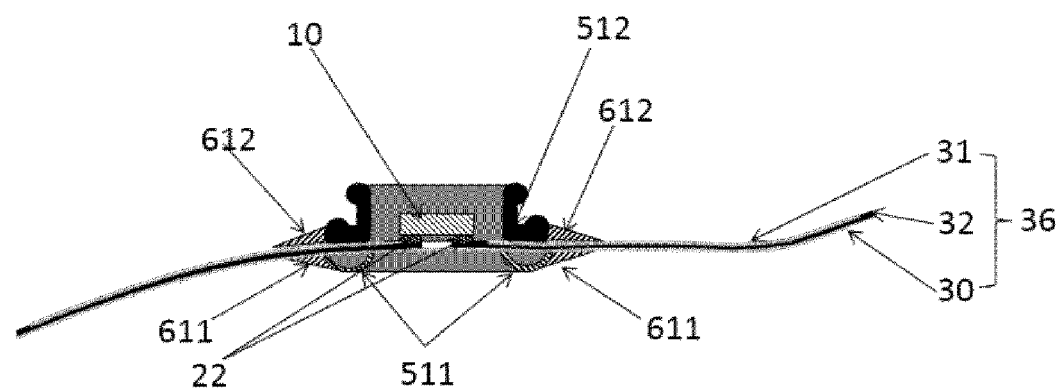
FIG. 13B is a schematic cross section view for explaining the manufacturing method of the light emitting device of working example 1.

The frame body of the upper side of the substrate includes the first member 512 and the second member 612. The first member 512 includes a male ring snap button having an outer diameter of 11 mm and an inner diameter of 1.5 mm and having a through hole in the center. The second member 612 has an outer diameter of 20 mm, has a wedge-shaped cross section shape and includes a silicone based resin. The second member 612 surrounds the outer periphery of the first member 512 and is joined to the first member 512. The frame body including the first member 512 and the second member 612 is fitted with the claw members 5115 from the upper side of the substrate. As shown in FIG. 13B, the substrate is thereby sandwiched by the frame body comprising the first member 512 and the second member 612 on the light emitting element 10 mounting surface side of the substrate, and the frame body comprising the third member 511 and the fourth member 611 on the lower side of the substrate.

Figure 13C:
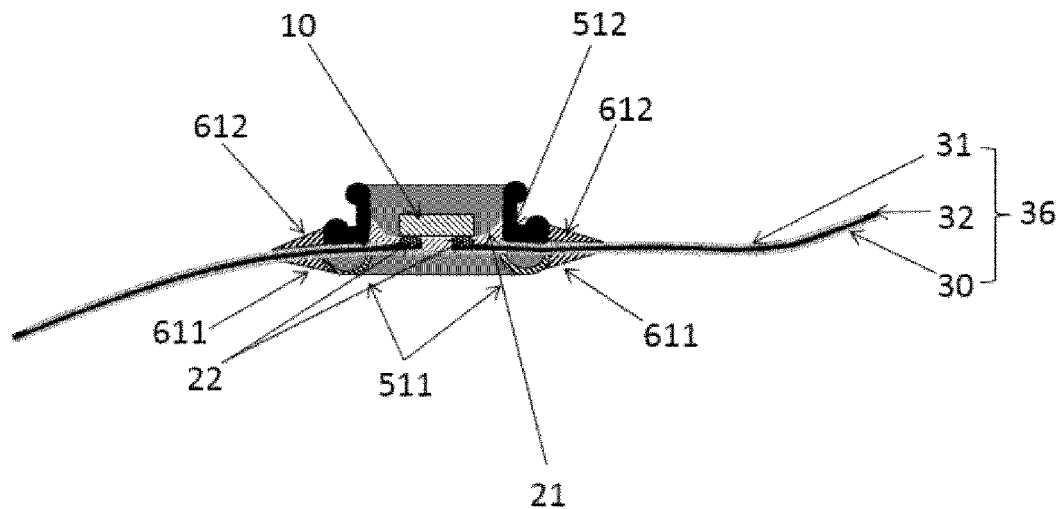
FIG. 13C is a schematic cross section view for explaining the manufacturing method of the light emitting device of working example 1.

As shown in FIG. 13C, a white light reflective silicone based resin, which is the underfill 21 for increasing the light extraction efficiency, is applied using a dispenser at the bottom of and the periphery of the LED chip inside the through hole of the male ring snap button. Preferably, at least a portion of the side surface of the light emitting element 10 is exposed from the underfill, and more preferably, the entire side surface is exposed.

Figure 13D:
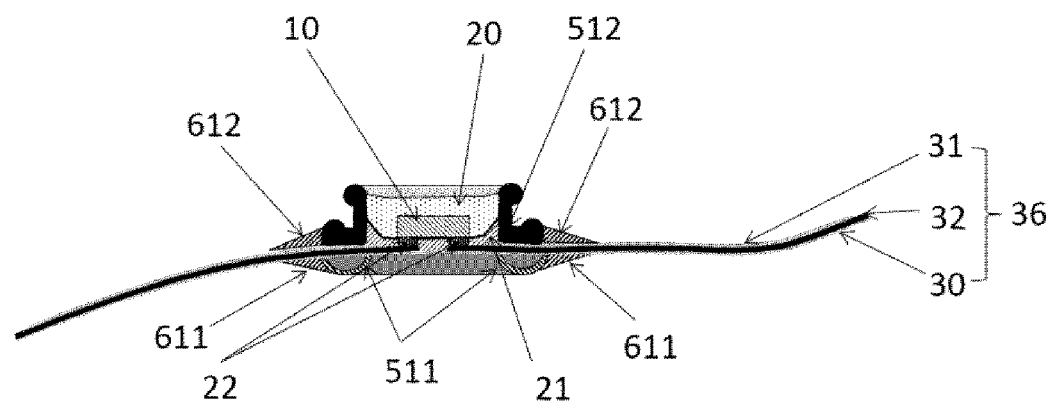
FIG. 13D is a schematic cross section view for explaining the manufacturing method of the light emitting device of working example 1.
Figure 13E:
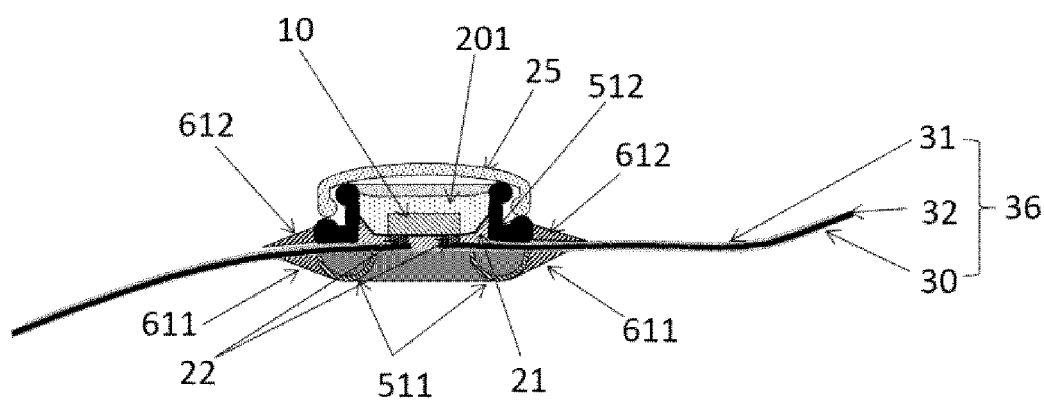
FIG. 13E is a schematic cross section view for explaining the manufacturing method of the light emitting device of working example 1.

As shown in FIG. 13D, using a silicone based transparent sealing resin containing inorganic compound crystal grains (for example, average particle diameter 20 μm YAG:Ce phosphor particles) which is the wavelength conversion member for converting a portion of the blue light emitted by the LED chip to yellow light as the sealing member 20, potting is done at the top and periphery of the LED chip inside the through hole of the male ring snap button (also called resin heaping, or mold sealing) using a dispenser, after which the silicone based resin undergoes thermal curing, and the LED chip is sealed. The sealing member 20 contacts the light emitting element 10 and the underfill 21. The light emitting device is fabricated as described above.

As necessary, wavelength conversion may also be done by covering the male (or female) ring snap button with a phosphor-containing resin cap.

With the description above, for the frame body of the upper side of the substrate and the frame body of the lower side of the substrate, the claw parts were engaged and deformation was done to sandwich the substrate by the substrate upper side frame body and the substrate lower side frame body, but it is also possible to sandwich the substrate using a coupling member (e.g. a thread, pin, etc.) for the substrate upper side frame body and the substrate lower side frame body.

With the description above, the substrate upper side frame body and the substrate lower side frame body were arranged after the light emitting element was mounted on the substrate, but it is also possible to arrange the LED chip on the substrate after mounting the substrate upper side frame body and the substrate lower side frame body. By mounting the parts in such sequence, stress applied to the LED chip and solder when removing the reinforcing plate is suppressed, making it possible to suppress initial failure.

In this way, by changing the shape and material properties of the fourth member 611 and the second member 612, so that the rigidity of the fourth member and the second member decrease as distance increases from the third member and the first member, there is lessening of the deformation amount of the wire at the substrate on which the third member is arranged and the peripheral edge due to deformation of the substrate when external force is applied, suppressing wire breakage, thus improving the reliability of the electrical connection. With the description above, because the fourth member and the second member are provided at both sides of the substrate, the substrate is positioned in the vicinity of the neutral surface with small tensile stress and compression stress due to the bending force, so is even more preferable in terms of improving the reliability of the electrical connection.

Working Example 2

As working example 2, the light emitting device 800 shown in FIG. 11F is fabricated as shown hereafter.

As shown in FIG. 11A, an FPC is prepared as the substrate 36, and a through hole 40 is provided in the substrate 36, positioned between the wires inside the light emitting element mounting region.

As the light emitting element 10, an LED chip (0.5 mm×0.5 mm×0.15 mm thick) having a pair of electrodes on one surface is mounted with the junction down on the substrate as shown in FIGS. 11A and 11B with an SnAgCu solder paste interposed. The substrate on which the LED chip is mounted in this way is aligned so that the LED chip is fit in a recess of the mold (lower mold 41) having a recess for forming a lens as shown in FIG. 11C, and is sandwiched by the upper mold 42 and the lower mold 41. The mold does not have to be made of metal, and for example with potting (mold sealing), a resin mold, etc. is also acceptable.

Next, using vacuum cast molding, thermosetting transmissive sealing resin (liquid silicone resin, etc.) is injected through the through hole 40, a lens (outer diameter 6 mm, for example) is formed as the sixth member 613 on the substrate on the side on which the LED chip is mounted as shown in FIG. 11C, and furthermore, as shown in FIG. 11D, white light reflective silicone based resin is injected as the underfill 21 and cured to fill the gap between the lens and the substrate and close the through hole, and then this is removed from the mold (FIG. 11E).

A copper disk (thickness 1 mm, outer diameter 3 mm, for example) which is the fifth member 510, which covers the through hole 40 and the range of the substrate 36 which has a marked decrease in rigidity due to temperature rise during operation at maximum output of the LED chip, is adhered to the substrate 36 as shown in FIG. 11F. Accordingly, a light emitting device is fabricated with a plurality of LED chips and lenses are arranged on the substrate 36.

When the base 30 of the substrate 36 is made of resin that may be degraded by absorbing light emitted from the light emitting element 10, by removing the base 30 in the region with high light density directly under the light emitting element 10 and filling with the underfill 21, it is possible to prevent short circuit failure due to degradation of the insulation of the substrate 36. It is also possible to obtain the desired light distribution by changing the lens mold shape. Furthermore, by adhering a transmissive sealing member to the side surface of the LED chip to do potting of the transmissive sealing member before the underfill 21, the light extraction efficiency from the LED chip side surface is raised more than with the method of potting the underfill first, resulting in a brighter light emitting device.

Working Example 3

As working example 3, the light emitting device 600 shown in FIG. 9 is fabricated as described hereafter.

An FPC is prepared as the substrate 36, and up to mounting the LED chip (0.5 mm×0.5 mm×0.15 mm thick) as the light emitting element 10 is the same as with working example 1.

As the first member, for example, a lens (outer diameter 11 mm, inner diameter 2 mm) formed by injection molding of a resin material such as a PMMA (polymethyl methacrylate resin, tensile elastic modulus 3.4 GPa) or the like with an index of refraction of 1.49 is used. The lens material is not limited to being PMMA, and it is also possible to form an integrated article using a mold with the injection molding method using a material with index of refraction 1.59 such as a light transmissive resin such as a polycarbonate (PC, tensile elastic modulus 2.6 to 3.1 GPa), epoxy resin (EP, tensile elastic modulus 2.6 to 3 GPa) or the like, or glass (tensile elastic modulus 35 to 45 GPa), etc.

As shown in FIG. 9, the lens that is the first member 520 is arranged covering the LED chip on the substrate on the LED chip mounting side, and joined using an adhesive agent.

On the outer periphery of the lens of the first member 520 on the substrate, as the second member 60, white silicone resin (tensile elastic modulus 4 MPa) is formed by molding at a width of 4.5 mm with a wedge shaped cross section shape (inside thickness 1.5 mm, outside thickness 0.1 mm). Forming may be done by applying using the dispensing method, but it is possible to better control the cross section shape using mold forming, and is preferable in terms of rigidity uniformity and reproducibility. By joining the outer periphery of the lens of the first member 520 and the substrate and the second member 60, it is possible to prevent wire breakage of the wire 32 and to strengthen the junction with the first member 520.

Accordingly, the light emitting device is fabricated with a plurality of LED chips and lenses are arranged on the substrate 36.

Working Example 4

As working example 4, the light emitting device 400 shown in FIG. 7 is fabricated as explained hereafter. As shown in FIG. 7, a composite material (cloth) of heat resistant fiber and enameled wire (core wire diameter 0.1 mm, copper (tensile elastic modulus 115 GPa)) is used as the substrate. FIG. 7 is illustrated with the warp threads and weft threads described later reduced to ⅒.

For example, with formation as a woven fabric (plain weave structure), using a heat resistant fiber polyimide fiber (tensile elastic modulus 3 to 5 GPa, single fiber fineness 1.7 dtex staple fiber spun yarn, two ply yarn of diameter approximately 0.1 mm) for the warp thread 301 and the weft thread 302 to form a ground weave, enameled wires as the wire 331 are arrayed at a ratio of 1 to 30 ground warp threads (pitch 60 mm), and enameled wires are inserted at a ratio of 1 to 30 ground weft threads (pitch 60 mm) for arrangement on the ground weft thread. At the edge parallel to the cloth weft threads 302, a plurality of warp thread enameled wires are electrically connected to a cord connected to a power supply 102, and at the edge parallel to the cloth warp threads 301, a plurality of weft thread enameled wires are electrically connected to the cord connected to the power supply. In the vicinity of the intersection points of the warp thread enameled wires and the weft thread enameled wires, branch wires connecting the LED chips are provided respectively on the warp thread enameled wires and the weft thread enameled wires.

At the locations of the cloth at which the branch wires are provided, arranged are items for which the fifth member 513 (outer diameter 3 mm) comprising a nylon resin coated copper disk (0.5 mm thick) and the sixth member 613 (0.5 mm thick, outer diameter 6 mm, inner diameter 3 mm) comprising a boron nitride particle-containing nylon resin (tensile elastic modulus 2 to 4 GPa) are made to be an integrated member by hot pressing in advance, and these are adhered to the cloth by hot pressing using a binder comprising nylon resin.

The branch wire tips and the electrodes of the light emitting elements 10 (0.5 mm×0.5 mm×0.15 mm thick LED chip using sapphire substrate) are connected using an electrically conductive paste (for example, silver paste, anisotropic conductive paste (ACP), etc.).

On the fifth members 513, a sealing member 201 (phosphor particle-containing silicone based resin) is provided in dome form covering the light emitting element 10.

Accordingly, a light emitting device is fabricated with a plurality of LED chips arranged on the substrate (cloth (or knitted fabric) with wires).

By using an insulating woven fabric, which includes a net body and knitted fabric, as the base, the substrate has excellent flexibility and elasticity, and the field of application for e-textiles, etc. is broader.

Working Example 5

As working example 5, the light emitting device 500 shown in FIG. 8 is fabricated as described hereafter.

As the base 30, a stretchable resin film of film thickness 30 μm and tensile elastic modulus 7 to 10 MPa is used. At both surfaces of this stretchable resin film, after arranging in waveform a 50 μm thick electrically conductive paste (tensile elastic modulus 225 MPa) that will be the wire 32 to form the electrical circuit pattern, the light emitting element mounting region of the wire is removed, and the substrate 36 for which wires of both surfaces are covered with stretchable resin film (film thickness 15 μm) is prepared.

In FIG. 8A and FIG. 8B, a wire 322 connected to the positive electrode of a DC power supply is arranged on the upper surface of the substrate 36, and a wire 321 connected to the negative electrode of the DC power supply is arranged on the lower surface of the substrate 36, and with the region in which the upper surface wire 322 and the lower surface wire 321 intersect as the light emitting element mounting region, a through hole is provided in the substrate 36 in a portion of this region to expose the lower surface wire, making it possible to mount the light emitting element. At the upper surface and lower surface of the substrate 36, prescribed connection locations of the power supply and various circuit elements and measuring equipment and the like are removed, and the insulating resin films 311, 312 are provided.

Using a low temperature curing type flexible electrically conductive adhesive (tensile elastic modulus 225 MPa) as the conductive connecting material 22, an LED chip (0.5 mm×0.5 mm×0.15 mm thick, using a sapphire substrate) as the light emitting element 10 is connected to the upper surface wire 322 and the lower surface wire 321.

A white thermosetting resin ring (plate thickness 0.2 mm, outer diameter 3 mm, inner diameter 1.5 mm, tensile elastic modulus approximately 3 GPa, for example) which is the first member 50 is adhered to the substrate 36 surrounding the light emitting element 10. Furthermore, a second member 60 of outer diameter 6 mm comprising a silicone based resin (tensile elastic modulus 1.4 MPa), having a wedge shaped cross section shape and provided with a slit, surrounding the outer periphery of the first member 50, is adhered to the substrate and the first member 50 outer periphery.

White light reflective silicone based resin for increasing the light extraction efficiency is applied using a dispenser to the lower part and outer periphery of the light emitting element 10 inside the first member 50.

By providing a slit structure, it is possible to prevent wire breakage of the wire 321.

As the sealing member 20, with a silicone based transparent sealing resin containing inorganic compound crystal grains (average particle diameter 20 μm YAG:Ce phosphor particles, for example), which is the light conversion member for converting a portion of the blue light emitted by the LED chip to yellow light, potting is done using a dispenser on the upper part and periphery of the LED chip inside the first member, after which the silicone based resin is thermally cured, sealing the LED chip.

In the embodiments noted above, examples around the light emitting element 10 are explained, but it is also possible to apply this around a connector, around a battery holder, or other items, making it possible to prevent wire breakage of the wire and the conductive connecting material on the flexible base, thus improving connection reliability.

This may be used for light emitting devices for which a light emitting element such as an LED element, etc. is mounted on a flexible base, such as e-textiles, wearable devices, etc.

What is claimed is:

1. A light emitting device comprising:
   a flexible substrate including a flexible base and a wire arranged on the flexible base;
   a plurality of light emitting elements mounted only on one side of the substrate;
   a conductive connecting material connecting each of the light emitting elements to the wire; and
   a plurality of first holding members arranged only on an opposite side surface to a surface of the one side of the substrate on which the light emitting elements are mounted, the first holding members being spaced apart from each other;
   a plurality of second holding members arranged on the surface of the substrate on which the light emitting elements are mounted, wherein
   each of the first holding members surrounds a region corresponding to a region on the substrate including a corresponding one of the light emitting elements and the conductive connecting material in a plan view,
   the first holding members are arranged adjacent to the wire,
   each of the first holding members includes
     an inner region arranged on an inner side of the each of the first holding members, and having higher rigidity than rigidity of the flexible base, and
     an outer region arranged adjacent to the inner region outside the inner region, and having lower rigidity than rigidity of the inner region,
     the inner region and the outer region of each of the first holding members do not protrude above the surface of the one side of the substrate on which the light emitting elements are mounted,
   each of the second holding members surrounds the region corresponding to the region on the substrate including the corresponding one of the light emitting elements and the conductive connecting material in the plan view,
   the second holding members are in contact with the flexible substrate, and
   each of the second holding members includes
     a first region arranged on an inner side of the each of the second holding members, and having higher rigidity than rigidity of the flexible base, and
     a second region arranged adjacent to the first region outside the first region, and having lower rigidity than rigidity of the first region.

2. The light emitting device according to claim 1, wherein the inner region includes an inner member, and the outer region includes an outer member different from the inner member.

3. The light emitting device according to claim 2, wherein the inner member and the outer member are joined together such that joining force between the inner member and the outer member is greater than joining force between the outer member and the substrate.

4. The light emitting device according to claim 2, wherein the inner member is a ring provided with claws corresponding to a male ring snap button.

5. The light emitting device according to claim 2, wherein the outer member has a wedge-shaped cross section shape.

6. The light emitting device according to claim 1, wherein a maximum thickness of the inner region of each of the first holding members is greater than a maximum thickness of the outer region of a respective one of the first holding members as measured along a direction orthogonal to the surface of the substrate.

7. The light emitting device according to claim 1, wherein a maximum thickness of the first region of each of the second holding members is greater than a maximum thickness of the second region of a respective one of the second holding members as measured along a direction orthogonal to the surface of the substrate.

8. The light emitting device according to claim 1, wherein the wire of the flexible substrate extends outwardly beyond each of the first holding members in the plan view.

9. The light emitting device according to claim 1, wherein each of the second holding members does not protrude below the opposite side surface to the surface of the one side of the substrate on which the light emitting elements are mounted.

\* \* \* \* \*